US012709801B2

(12) United States Patent
Chou et al.

(10) Patent No.: US 12,709,801 B2
(45) Date of Patent: Aug. 18, 2026

(54) MANUFACTURING METHOD OF SEMICONDUCTOR DEVICE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Chun-Yi Chou, Hsinchu City (TW); Chih-Piao Chuu, Hsinchu City (TW); Miin-Jang Chen, Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 682 days.

(21) Appl. No.: 18/163,019

(22) Filed: Feb. 1, 2023

(65) Prior Publication Data

US 2024/0102162 A1 Mar. 28, 2024

Related U.S. Application Data

(60) Provisional application No. 63/377,050, filed on Sep. 26, 2022.

(51) Int. Cl.
*C23C 16/455* (2006.01)
*C23C 16/40* (2006.01)
(Continued)

(52) U.S. Cl.
CPC ...... *C23C 16/45553* (2013.01); *C23C 16/401* (2013.01); *C23C 16/403* (2013.01); *C23C 16/4408* (2013.01); *C23C 16/45536* (2013.01); *C23C 16/45544* (2013.01); *C23C 16/505* (2013.01); *C23C 16/56* (2013.01)

(58) Field of Classification Search
CPC ........... C23C 16/45553; C23C 16/401; C23C 16/403; C23C 16/4408; C23C 16/45536; C23C 16/45544; C23C 16/505; C23C 16/56; C23C 16/45542
See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |

(Continued)

OTHER PUBLICATIONS

Chou, et al., "Atomic Layer Nucleation Engineering: Inhibitor-Free Area-Selective Atomic Layer Deposition of Oxide and Nitride", 2021, Chem. Mater., 33, p. 5584-5590 (Year: 2021).*

*Primary Examiner* — Gordon Baldwin
*Assistant Examiner* — Christina D Mcclure
(74) *Attorney, Agent, or Firm* — Birch, Stewart, Kolasch & Birch, LLP

(57) ABSTRACT

A method includes following steps. A first precursor is pulsed over a substrate such that first precursor adsorbs on a first region and a second region of the substrate. A first plurality of the first precursor adsorbing on the first region is then removed using a plasma, while leaving a second plurality of the first precursor adsorbing on the second region. A second precursor is then pulsed to the substrate to form a monolayer of a film on the second region and a material on the first region. The material is then removed using a plasma. The substrate is biased during removing the material.

20 Claims, 38 Drawing Sheets

(51) Int. Cl.

| | |
|---|---|
| ***C23C 16/44*** | (2006.01) |
| ***C23C 16/505*** | (2006.01) |
| ***C23C 16/56*** | (2006.01) |

(56) References Cited

U.S. PATENT DOCUMENTS

| | | | | |
|---|---|---|---|---|
| 9,236,300 | B2 | 1/2016 | Liaw | |
| 9,406,804 | B2 | 8/2016 | Huang et al. | |
| 9,443,769 | B2 | 9/2016 | Wang et al. | |
| 9,520,482 | B1 | 12/2016 | Chang et al. | |
| 9,548,366 | B1 | 1/2017 | Ho et al. | |
| 9,576,814 | B2 | 2/2017 | Wu et al. | |
| 9,831,183 | B2 | 11/2017 | Lin et al. | |
| 9,859,386 | B2 | 1/2018 | Ho et al. | |
| 2012/0100301 | A1* | 4/2012 | Kongkanand | H01M 4/8657 427/576 |
| 2015/0299848 | A1* | 10/2015 | Haukka | C23C 16/04 427/256 |
| 2018/0076020 | A1* | 3/2018 | Wu | H01L 21/02697 |
| 2019/0259650 | A1* | 8/2019 | Han | H10P 50/267 |
| 2020/0048762 | A1* | 2/2020 | Ke | C23C 16/04 |
| 2020/0354834 | A1* | 11/2020 | De Silva | C23C 16/04 |

* cited by examiner

MANUFACTURING METHOD OF SEMICONDUCTOR DEVICE

This application claims priority to U.S. Provisional Patent Application Ser. No. 63/377,050, filed Sep. 26, 2022, which is herein incorporated by reference in its entirety.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7-10A are cross-sectional views of a method for manufacturing a structure using the fabrication apparatus at various stages in accordance with some embodiments of the present disclosure.

DETAILED DESCRIPTION

Figure 1A:
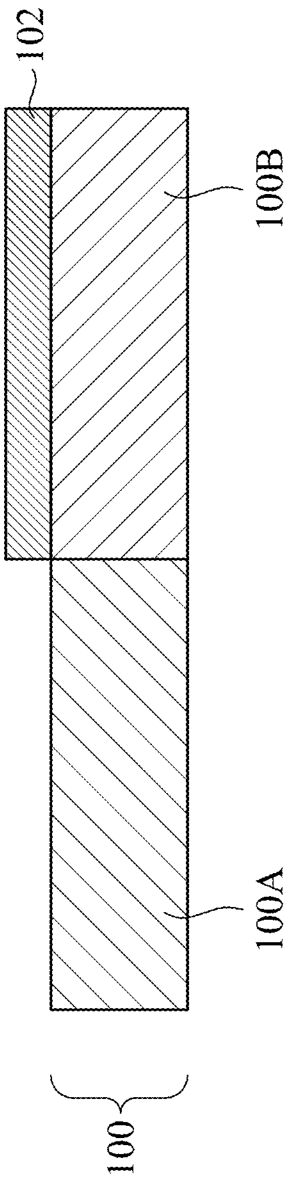
FIG. 1A shows a cross-sectional view of a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure relate to semiconductor structures and methods for forming semiconductor structures by an area-selective atomic layer deposition (AS-ALD).

FIG. 1A shows a cross-sectional view of a substrate 100. Referring to FIG. 1A, the substrate 100 may have a first region 100A and a second region 100B on one side of the first region 100A. For example, the second region 100B is adjacent to the first region 100A. In some embodiments, the first region 100A and the second region 100B include different compositions in order to have high deposition selectivity therebetween. In one case, the first region 100A may be a non-metal region, and the second region 100B may be a metal region. In some embodiments, the first region 100A includes silicon oxide ($SiO_2$), and the second region 100B includes metal, such as tungsten. In some embodiments where the second region 100B includes tungsten, a native oxide 102 may be grown on a surface of the second region 100B in which the native oxide 102 includes tungsten oxide.

Figure 1B:
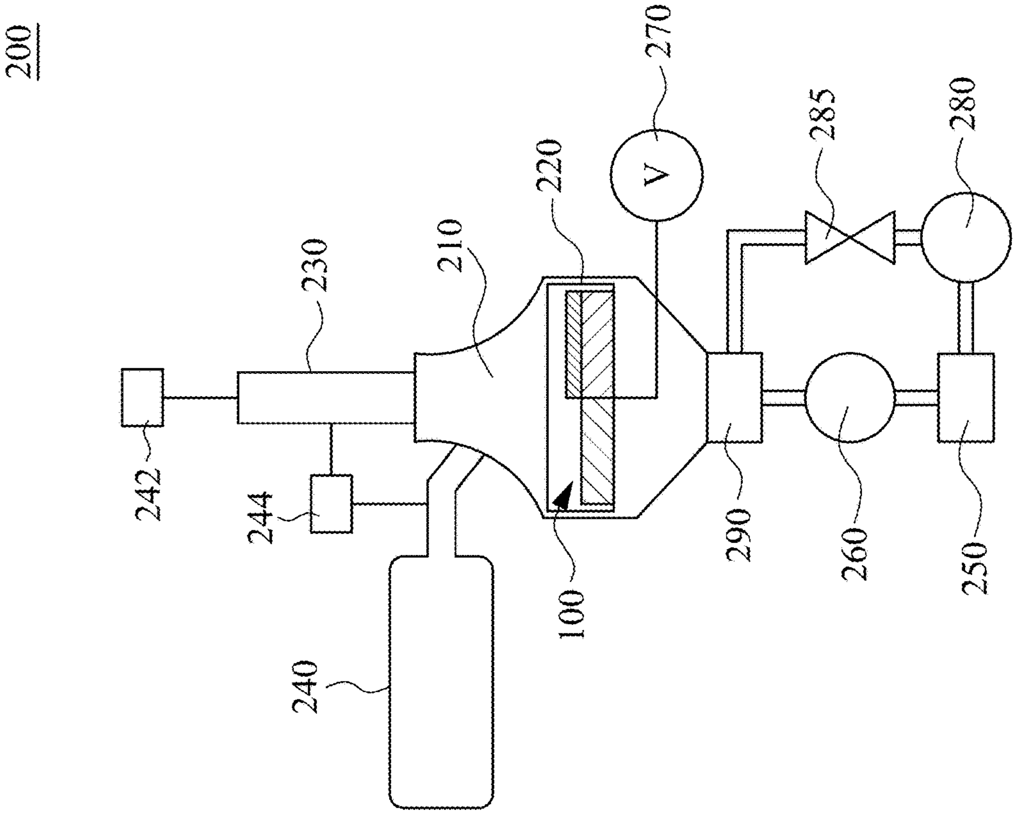
FIG. 1B shows a start of a process to form a film on the substrate by placing the substrate into a fabrication apparatus according to some embodiments of the present disclosure.

FIG. 1B shows a start of a process to form a film on the substrate 100 by placing the substrate 100 into a fabrication apparatus 200 according to some embodiments of the present disclosure. In an embodiment, the fabrication apparatus 200 includes a chamber 210, a chuck 220, a plasma source 230, a precursor delivery system 240, and a treatment gas delivery system 242. The chuck 220 is in the chamber 210, and the plasma source 230 and the precursor delivery system 240 are connected to the chamber 210. The fabrication apparatus 200 receives precursor gases from the precursor delivery system 240. A purge gas delivery system (not shown) may be connected to the chamber 210 to provide a purge gas to the chamber 210.

The plasma source 230 may be a remote plasma system which is separated from the chamber 210. A treatment gas is delivered from the treatment gas delivery system 242 into an internal volume of the plasma source 230 to flow from the plasma source 230 towards the substrate 100. A remote plasma may be generated in the plasma source 230 to produce radicals of the treatment gas. The remote plasma may also produce ions and other charged species of the treatment gas. For example, coils (not shown), which may be electrical communication with a radio frequency (RF) power source or a microwave plasma source, surround walls of the plasma source 230 and generate a remote plasma in the plasma source 230. The ions or charged species of the treatment gas may move to the surface of the substrate 100 to react or contact the substrate 100. The ions or charged species may freely drift toward the surface of the substrate 100 when an oppositely charged bias is provided on the chuck 220.

The fabrication apparatus 200 receives a precursor from the precursor delivery system 240. In other embodiments, more precursor delivery systems may be used. In some embodiments, the fabrication apparatus 200 further includes a turbo pump 250 and a pressure controller 260 (e.g., automatic pressure controller (APC)). The turbo pump 250 is connected to the chamber 210 through the pressure controller 260. In some embodiments, when the substrate 100 is positioned in the chamber 210, a vacuum is applied to the chamber 210 by the turbo pump 250 to remove oxygen and moisture. The pressure controller 260 is configured to control the pressure inside the chamber 210. In some embodiments, when the substrate 100 is positioned in the chamber 210, the temperature is raised to an acceptable level that is suitable for the deposition to form the film on the substrate 100. In some embodiments, the fabrication apparatus 200 further includes a bias source 270 connected to the chuck 220 as shown in FIG. 1B. The bias source 270 is configured to apply a bias to the chuck 220 and thus to the substrate 100 positioned thereon. In some embodiments, the bias source 270 is configured to apply a direct current (DC) bias, an alternating current (AC) bias, or a DC/AC superposed bias, to the chuck 220. In some embodiments, the bias source 270 is configured to apply positive or negative DC bias to the chuck 220 to accelerate or decelerate a deposition rate of the deposition process. In some embodiments, the bias is a radio frequency (RF) bias, and the frequency range thereof is in a range of about 3 kHz to about 300 GHz.

In some embodiments, the fabrication apparatus 200 in FIG. 1B further includes a rotary pump 280 and a valve (e.g., stop valve) 285. The rotary pump 280 is connected to the chamber 210 via the valve 285, and the rotary pump 280 is configured to pump out the purging gases and the excess precursors in the chamber 210 when the pressure controller 260 is turned off. In some other embodiments, the turbo pump 250 may pump out the purging gases and the excess precursors in the chamber 210 when the pressure controller 260 is turned on. In some embodiments, the fabrication apparatus 200 in FIG. 1B further includes a filter (e.g., trap filter) 290 connected to the chamber 210, the valve 285, and the pressure controller 260. The filter 290 is configured to trap the gases (e.g., the purging gases and/or precursors) and prevent the gases reflected toward the chamber 210.

Subsequently, a film may be formed on the first region 100A but not on the second region 100B using an area-selective atomic layer deposition process (AS-ALD) including a number of repeated deposition cycles by the fabrication apparatus 200. The AS-ALD may be a thermal ALD or a plasma-enhanced ALD. In some embodiments, a deposition cycle of the film may include a first precursor pulsing step, a pulsing step, a plasma removal step, a second precursor pulsing step, a pulsing step and a surface recovery step, which will be described in greater details below.

Figure 2:
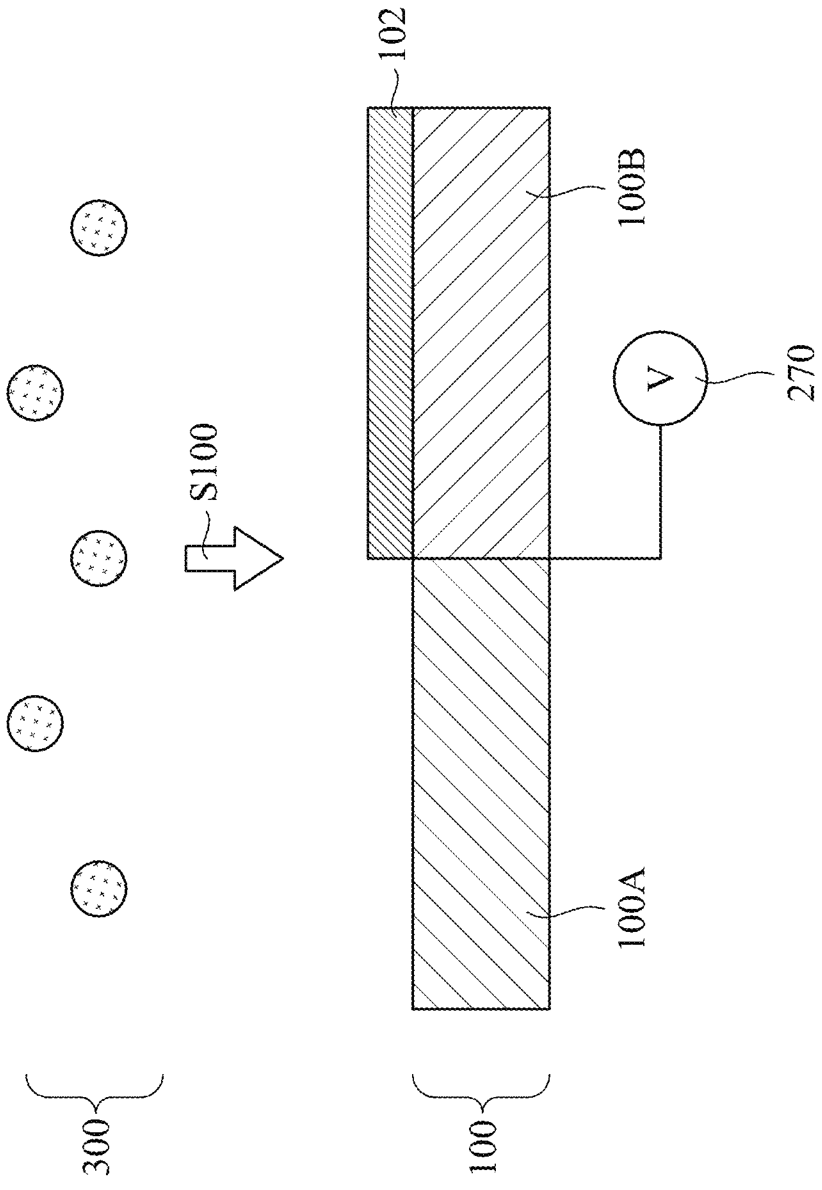
FIGS. 2-5 are cross-sectional views of a method for manufacturing a structure using the fabrication apparatus at various stages in accordance with some embodiments of the present disclosure.

FIGS. 2-5 and 7-10A are cross-sectional views of a method for forming a film using the fabrication apparatus 200 at various stages in accordance with some embodiments of the present disclosure. Reference is made to FIGS. 1B and 2. A pre-clean step (e.g., a clean operation) is performed to the substrate 100 before a subsequent deposition process. A treatment gas is delivered from the treatment gas delivery system 242 into an internal volume of the plasma source 230 to flow from the plasma source 230 towards the substrate 100. In some embodiments, the treatment gas includes inert gases, such as He, Ne, Ar, Kr, Xe and Rn, or a combination thereof. A remote plasma 300 may be generated in the plasma source 230 to produce radicals of the treatment gas. The remote plasma 300 may also produce ions and other charged species of the treatment gas. A bias voltage is applied to the chuck 220 by the bias source 270 and thus to the substrate 100 placed thereon during the pre-clean step. For example, by providing an oppositely charged bias on the chuck 220, the ions or charged species of the remote plasma 300 may move to the surface of the substrate 100 to contact the substrate 100 in a direction indicated by an arrow S100. The bias voltage attracts the ions or charged species from the remote plasma 300 to bombard the substrate 100 and hence clean the native oxide 102 from the second region 100B.

Figure 3:
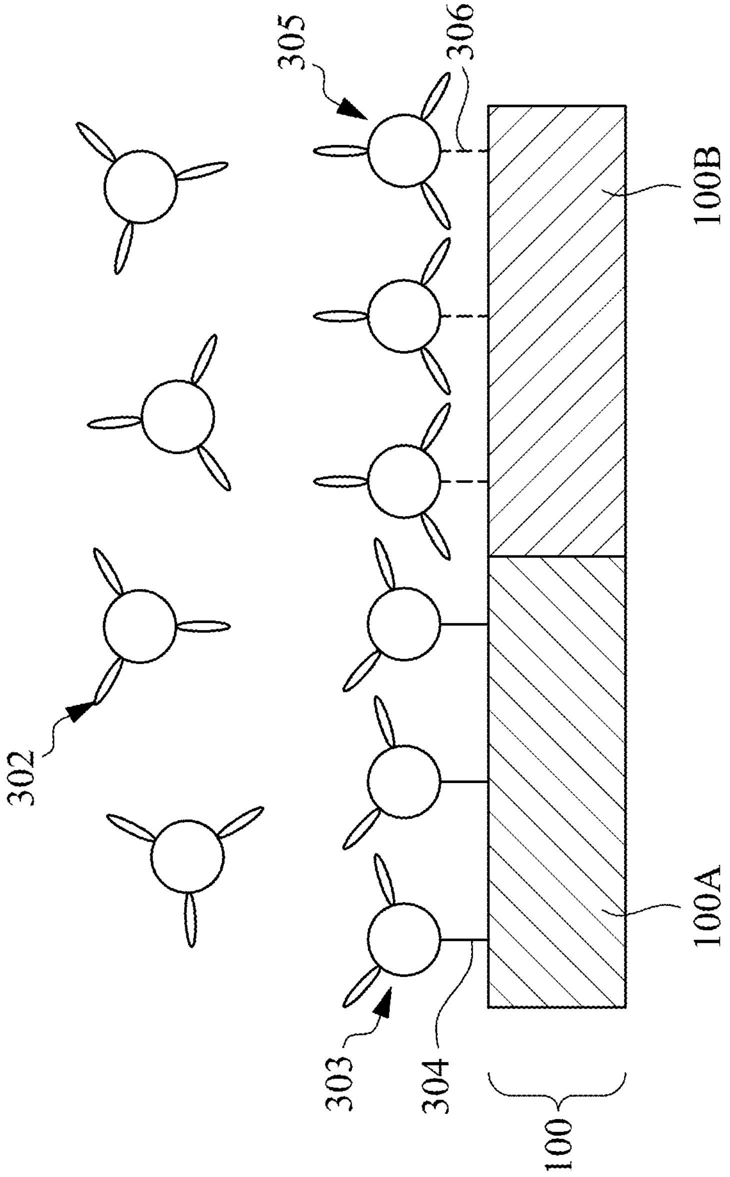

Reference is made to FIGS. 1B and 3. A first precursor (e.g., Trimethylaluminum (TMA), Triethylaluminium (TEA), Tetrakis(dimethylamido) aluminum (TDMAA)) 302 is pulsed into the chamber 210 of the fabrication apparatus 200 from the precursor delivery system 240. The first precursor 302 is a metal-containing precursor. The first precursor 302 has precursor molecules. For example, the first precursor 302 includes a first plurality of precursor molecules 303 adsorbs onto a top surface of the first region 100A and a second plurality of precursor molecules 305 adsorbing onto a top surface of the second region 100B. That is, the top surface of the first region 100A and the first precursor 302 have bonds 304 therebetween, and the top surface of the second region 100B and the first precursor 302 have bonds 306 therebetween. Due to the composition difference between the first region 100A and the second region 100B, the bonds 304 between the first precursor 302 and the first region 100A have a first binding energy being different from a second binding energy of the bonds 306 between the first precursor 302 and the second region 100B. The first binding energy is greater than the second binding energy, and thus the bonds 304 between the first precursor 302 and the first region 100A are represented as rigid lines, and the bonds 306 between the first precursor 302 and the second region 100B are represented as dotted lines.

Figure 4:
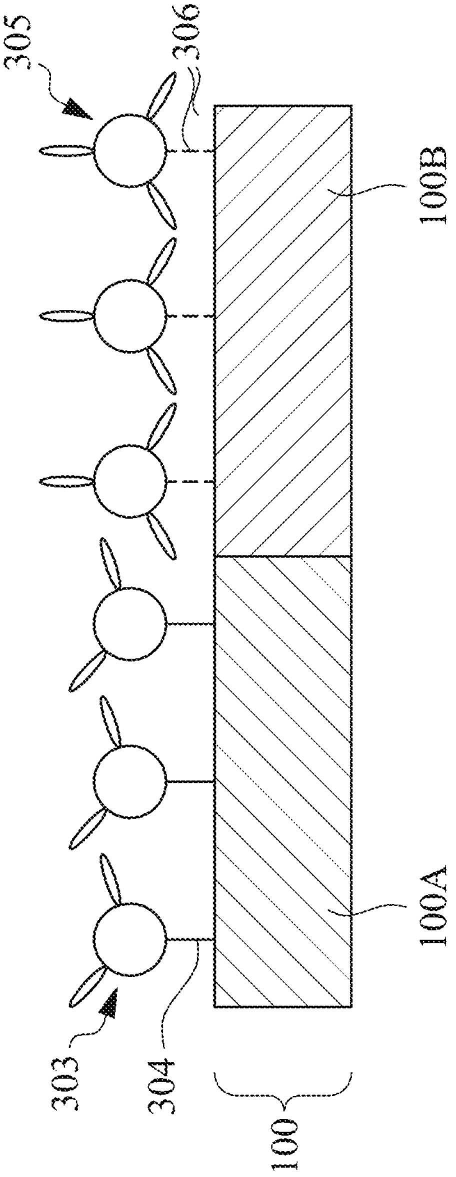

Reference is made to FIGS. 1B and 4. An excess portion of the first precursor 302 is purged from over the substrate 100 with a purge gas. For example, a control unit 244 may disconnect the precursor delivery system 240 and to connect a purge gas delivery system (not shown) to deliver a purge gas to the chamber 210. In some embodiments, the purge gas may include argon (Ar), nitrogen ($N_2$), xeon (Xe), or other non-reactive gas. In some embodiments, the control unit 244 may also initiate the rotary pump 280 to aid in the removal of the excess portion of the first precursor 302.

Figure 5:
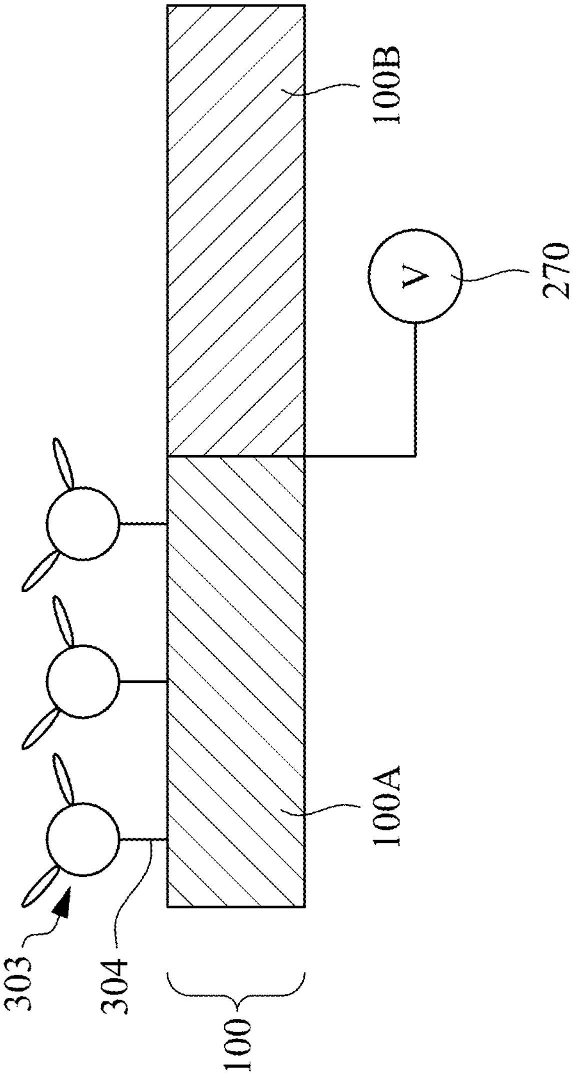

Reference is made to FIGS. 1B and 5. A plasma removal procedure is performed on the substrate 100 to remove the second plurality of precursor molecules 305 adsorbed on the second region 100B of the substrate 100. The bonds 306 that bind the second plurality of precursor molecules 305 and the second region 100B are broken, while leaving the bonds 304 that bind the first plurality of precursor molecules 303 and the first region 100A intact. A treatment gas is delivered from the treatment gas delivery system 242 into an internal volume of the plasma source 230 to flow from the plasma source 230 towards the substrate 100. In some embodiments, the treatment gas includes inert gases, such as He, Ne, Ar, Kr, Xe and Rn, or a combination thereof. A remote plasma 300 may be generated in the plasma source 230 to produce radicals of the treatment gas. The remote plasma 300 may also produce ions and other charged species of the treatment gas. By controlling a plasma energy in the plasma removal procedure, the first precursor 302 adsorbed on the second region 100B can be removed without removing the first precursor 302 adsorbed on the first region 100A. For example, the plasma energy is large enough to break the bonds 306 (see FIG. 4) between the first precursor 302 and the second region 100B and is too small to break the bonds 304 between the first precursor 302 and the first region 100A. The top surface of first region 100A can be referred to as a growth area (GA), while the top surface of the second region 100B can be referred to as non-growth area (NGA).

Figure 6:
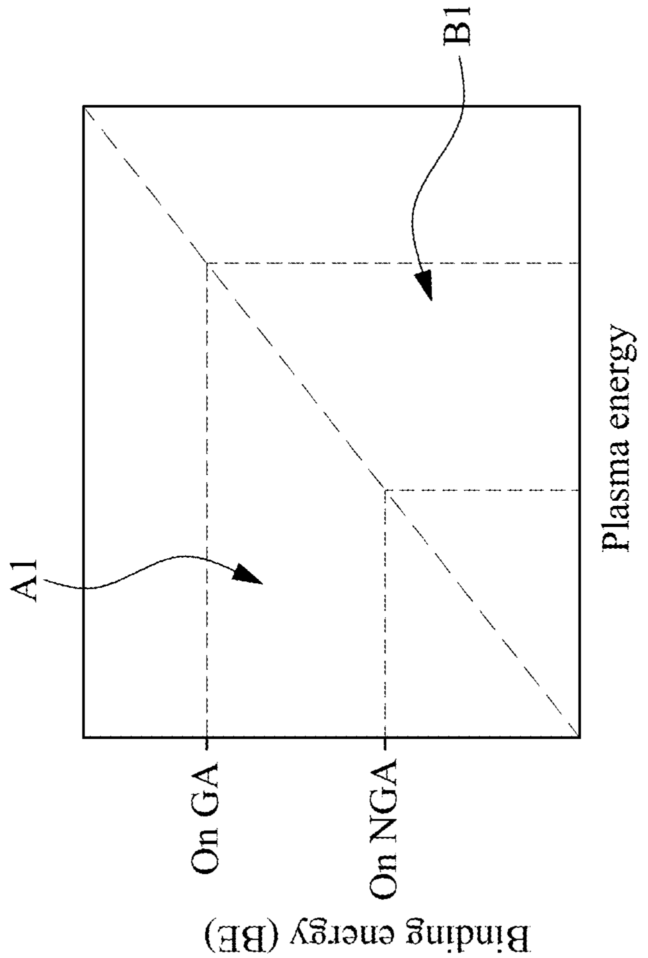
FIG. 6 is a schematic diagram showing a binding energy versus plasma energy in accordance with some embodiments.

FIG. 6 is a schematic diagram showing a binding energy (BE) versus plasma energy in accordance with some embodiments. The diagram shows that the binding energy is in positive correlation with the plasma energy. Referring to FIGS. 5 and 6. The binding energy of the bond 304 between the first precursor 302 and the first region 100A is labeled as “On GA”, the binding energy of the bond 306 between the first precursor 302 and the second region 100B is labeled as “On NGA.” An area between the “On GA” and the “On NGA” is labeled as “A1.” Plasma energy in an area labeled as “B1” is a range of the plasma energy required to break the bond having the bonding energy “On NGA,” while not breaking the bond having the bonding energy “On GA.” By performing the plasma removal procedure using the plasma energy within the area “B1,” the bonds 306 between the first precursor 302 and the second region 100B are broken and carried away by the treatment gas, while the bonds 304 between the first precursor 302 and the first region 100A are not broken.

In some embodiments, the plasma energy in the plasma removal procedure can be controlled by applying the bias voltage to the chuck 220 (see FIG. 1B) by the bias source 270 and thus to the substrate 100 placed thereon, adjusting a power of the plasma source 230, or both. For example, by providing an oppositely charged bias on the chuck 220, the ions or charged species of the plasma may move to the surface of the substrate 100 to contact the substrate 100. The bias voltage attracts the ions or charged species from the plasma to bombard the substrate 100 and hence remove the un-desired first precursor 302 adsorbed on the second region 100B. In some embodiments where the first precursor 302 includes TMA, the bias voltage applied to the chuck 220 is in a range from about 128 V to about 132 V, such as 130V, for a duration in a range from 28 seconds to 32 seconds, such as 30 seconds.

Figure 7:
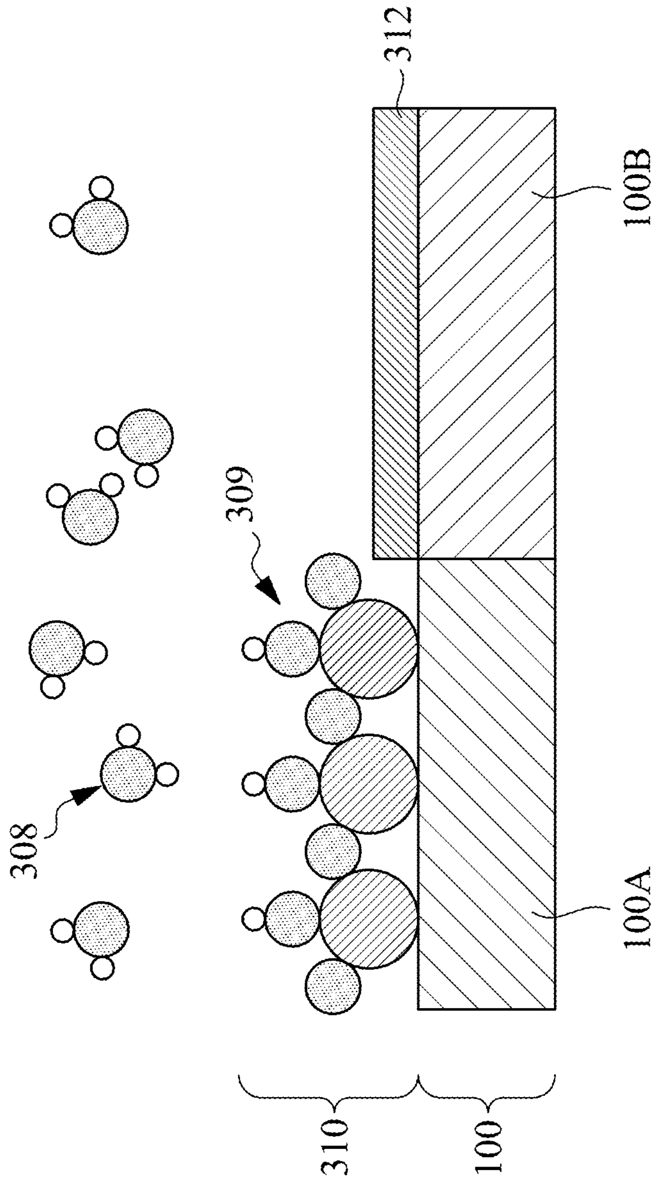

Reference is made to FIGS. 1B and 7. A second precursor 308 is pulsed into the chamber 210 of the fabrication apparatus 200 from the precursor delivery system 240. In some embodiments, the second precursor 308 is an oxygen-containing gas, for example, $H_2O$ vapor, $O_3$, $O_2$, or a combination thereof. The second precursor 308 has a third plurality of precursor molecules 309 reacting with the first plurality of precursor molecules 303 of the first precursor 302 (see FIG. 5) adsorbed on the first region 100A, forming a monolayer 310 of $Al_2O_3$. The second precursor 308 has a fourth plurality of precursor molecules (not labeled) reacting with the second region 100B. As a result, native oxide 312 may grow on the surface of the second region 100B during pulsing the second precursor 308. In some embodiments where the second region 100B includes tungsten, the native oxide 312 is tungsten oxide.

Figure 8:
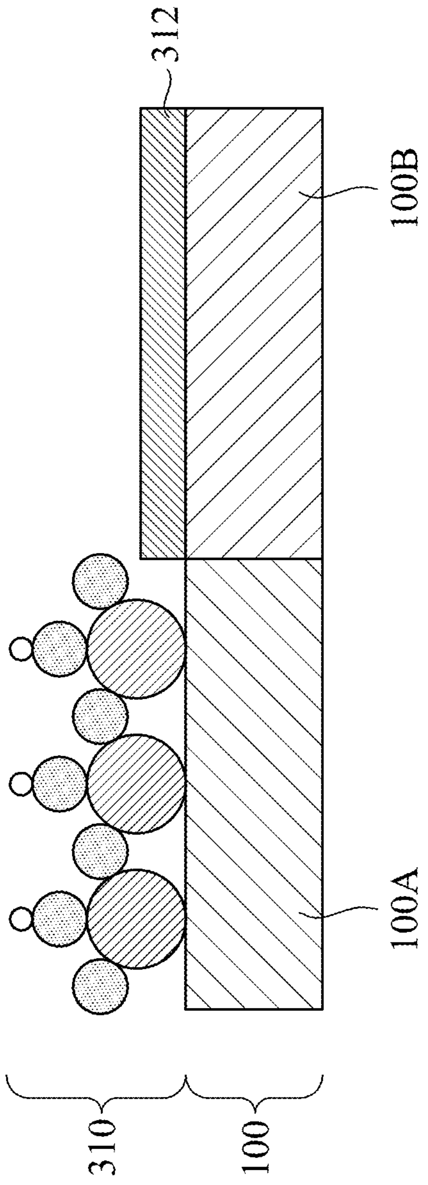

Reference is made to FIGS. 1B and 8. An excess portion of the second precursor 308 is purged from over the substrate 100 with a purge gas after pulsing the second precursor 308. For example, the control unit 244 may disconnect the precursor delivery system 240 and to connect a purge gas delivery system (not shown) to deliver a purge gas to the chamber 210. In some embodiments, the purge gas may include argon (Ar), nitrogen ($N_2$), xeon (Xe), or other non-reactive gas. In some embodiments, the control unit 244 may also initiate the rotary pump 280 to aid in the removal of the excess portion of the second precursor 308.

Figure 9:
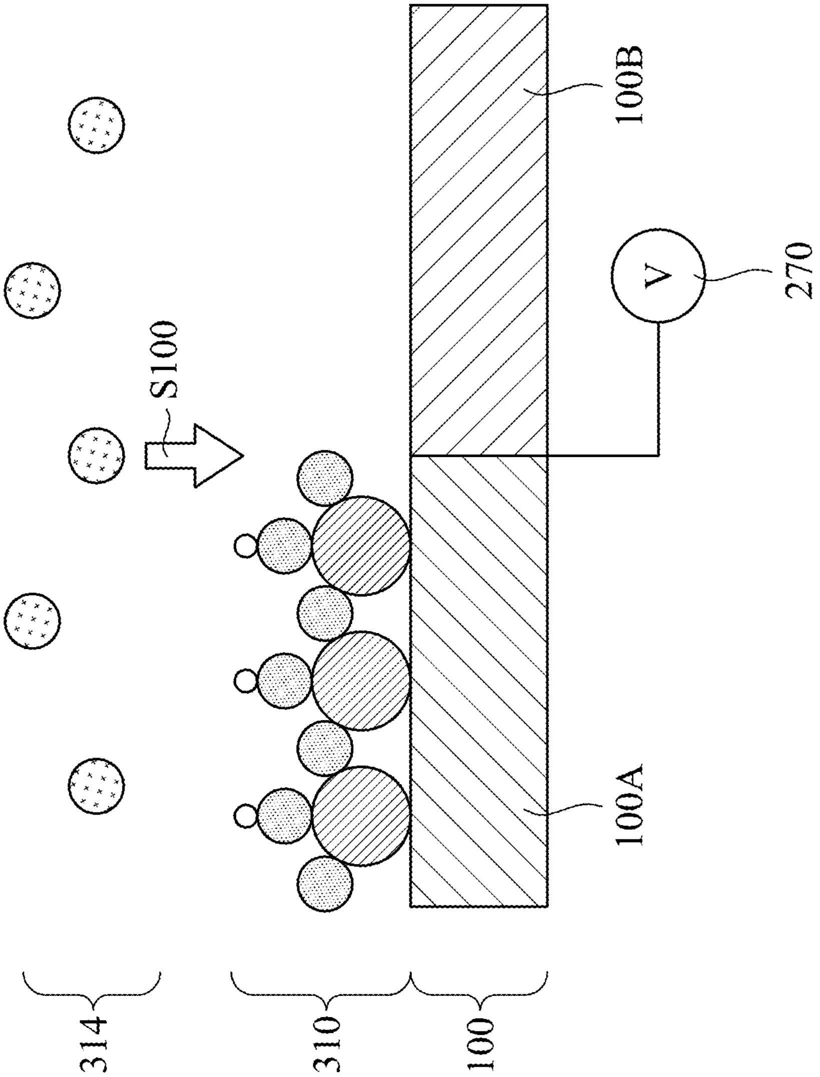

Reference is made to FIGS. 1B and 9. A surface recovery step is performed to the substrate 100 to remove the native oxide 312 grown on the second region 100B of the substrate 100 before a next deposition cycle of the film. A treatment gas is delivered from the treatment gas delivery system 242 into an internal volume of the plasma source 230 to flow from the plasma source 230 towards the substrate 100. In some embodiments, the treatment gas includes inert gases, such as He, Ne, Ar, Kr, Xe and Rn, or a combination thereof. A remote plasma 300 may be generated in the plasma source 230 to produce radicals of the treatment gas. A remote plasma 314 may also produce ions and other charged species of the treatment gas. By controlling a plasma energy in the surface recovery step, the native oxide 312 grown on the second region 100B can be removed without removing the monolayer 310 adsorbed on the first region 100A. For example, the plasma energy is large enough to break the bonds between the native oxide 312 and the second region 100B and is too small to break the bonds between the monolayer 310 and the first region 100A.

In some embodiments, the plasma energy in the plasma removal procedure can be controlled by applying the bias voltage to the chuck 220 (see FIG. 1B) by the bias source 270 and thus to the substrate 100 placed thereon, adjusting a power of the plasma source 230, or both. For example, by providing an oppositely charged bias on the chuck 220, the ions or charged species of the plasma may move to the surface of the substrate 100 to contact the substrate 100. The bias voltage attracts the ions or charged species from the plasma to bombard the substrate 100 and hence remove the un-desired native oxide grown on the second region 100B. In some embodiments, the bias voltage applied to the chuck 220 is in a range from about 138 V to about 142 V, such as 140V, for a duration in a range from 28 seconds to 32 seconds, such as 30 seconds.

By controlling a plasma energy in the surface recovery step, the native oxide 312 grown on the second region 100B can be removed without removing the monolayer 310 adsorbed on the first region 100A. For example, the plasma energy is large enough to break the bonds between the native oxide 312 and the second region 100B and is too small to break the bonds between the monolayer 310 and the first region 100A.

Figure 10A:
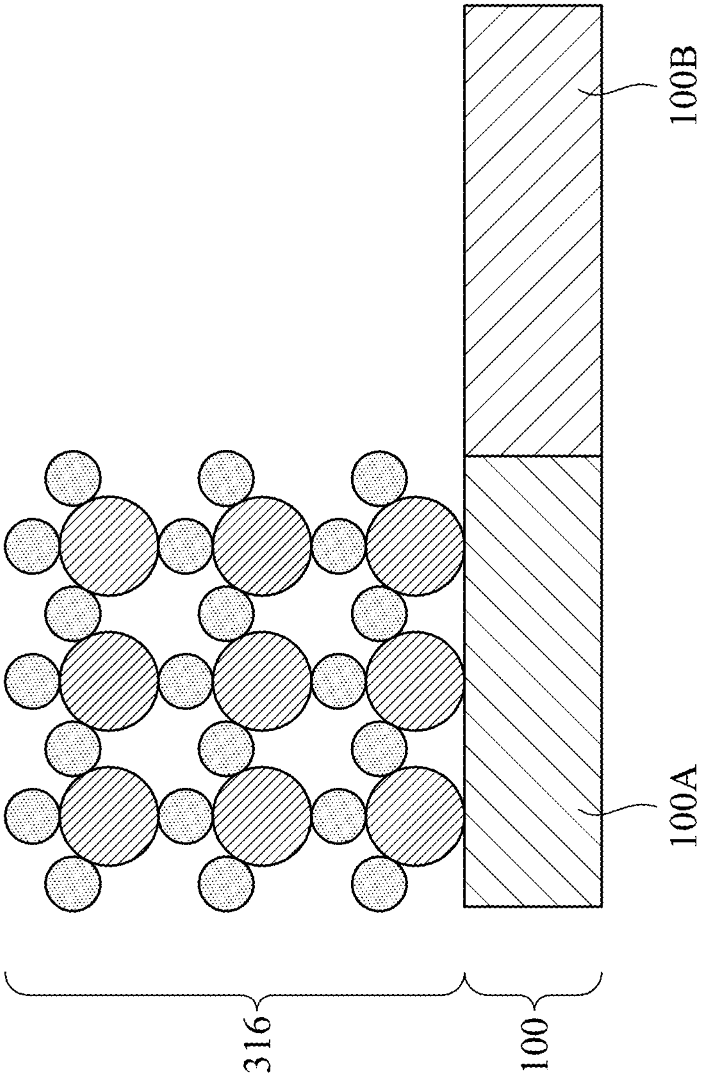

By repeating the deposition cycles including steps of FIGS. 3-5 and 7-9, a film 316 with a desired thickness is thereby formed on the first region 100A but not on the second region 100B of the substrate 100, as shown in FIG. 10A. A self-aligned growth on the first region 100A is achieved. A selectivity of nucleation of the as-deposited film 316 can be promoted without forming an inhibitor on the second region 100B to inhibit the nucleation on the second region 100B.

Figure 10B:
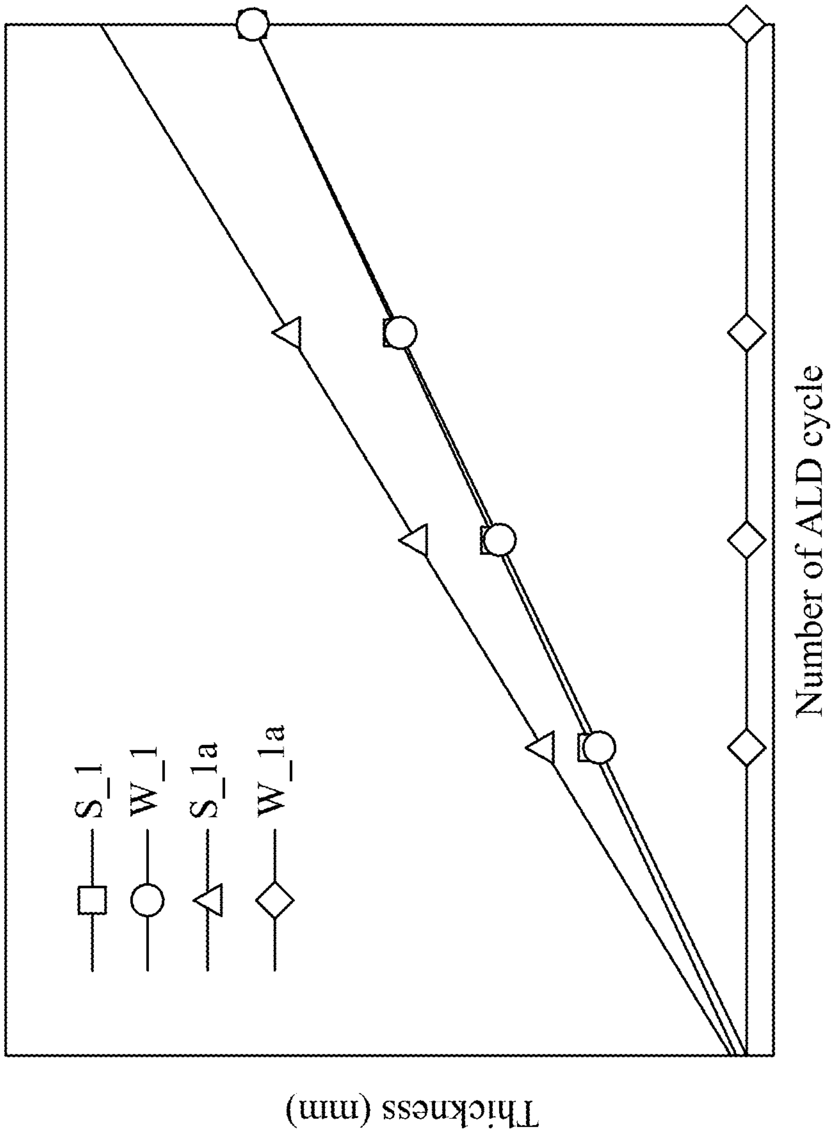
FIG. 10B is a schematic diagram of a thickness of an aluminum oxide film deposited on substrates including different compositions versus a number of an ALD cycle in accordance with some embodiments.

FIG. 10B is a schematic diagram of a thickness of an aluminum oxide film deposited on substrates including different compositions versus a number of an ALD cycle in accordance with some embodiments. Line S_1 represents an aluminum oxide film deposited on a silicon oxide substrate without a plasma removal step (see FIG. 5) and a surface recovery step (see FIG. 9). Line W_1 represents an aluminum oxide film deposited on a tungsten substrate without using a plasma removal step and a surface recovery step. For lines S_1 and W_1, as the number of the ALD cycle increases, the thickness of the aluminum oxide film increases linearly.

Line S_1*a* represents an aluminum oxide film deposited on a silicon oxide substrate using a plasma removal step and a surface recovery step. Line W_1*a* represents an aluminum oxide film deposited on a tungsten substrate using a plasma removal step and a surface recovery step. For line S_1*a*, as the number of the ALD cycle increases, the thickness of the aluminum oxide film increases linearly. For line W_1*a*, as the number of the ALD cycle increases, the thickness of the aluminum oxide film remains zero. That is, by using the plasma removal step and the surface recovery step, no aluminum oxide would be formed on the tungsten substrate even if the number of the ALD cycles increases.

Figure 10C:
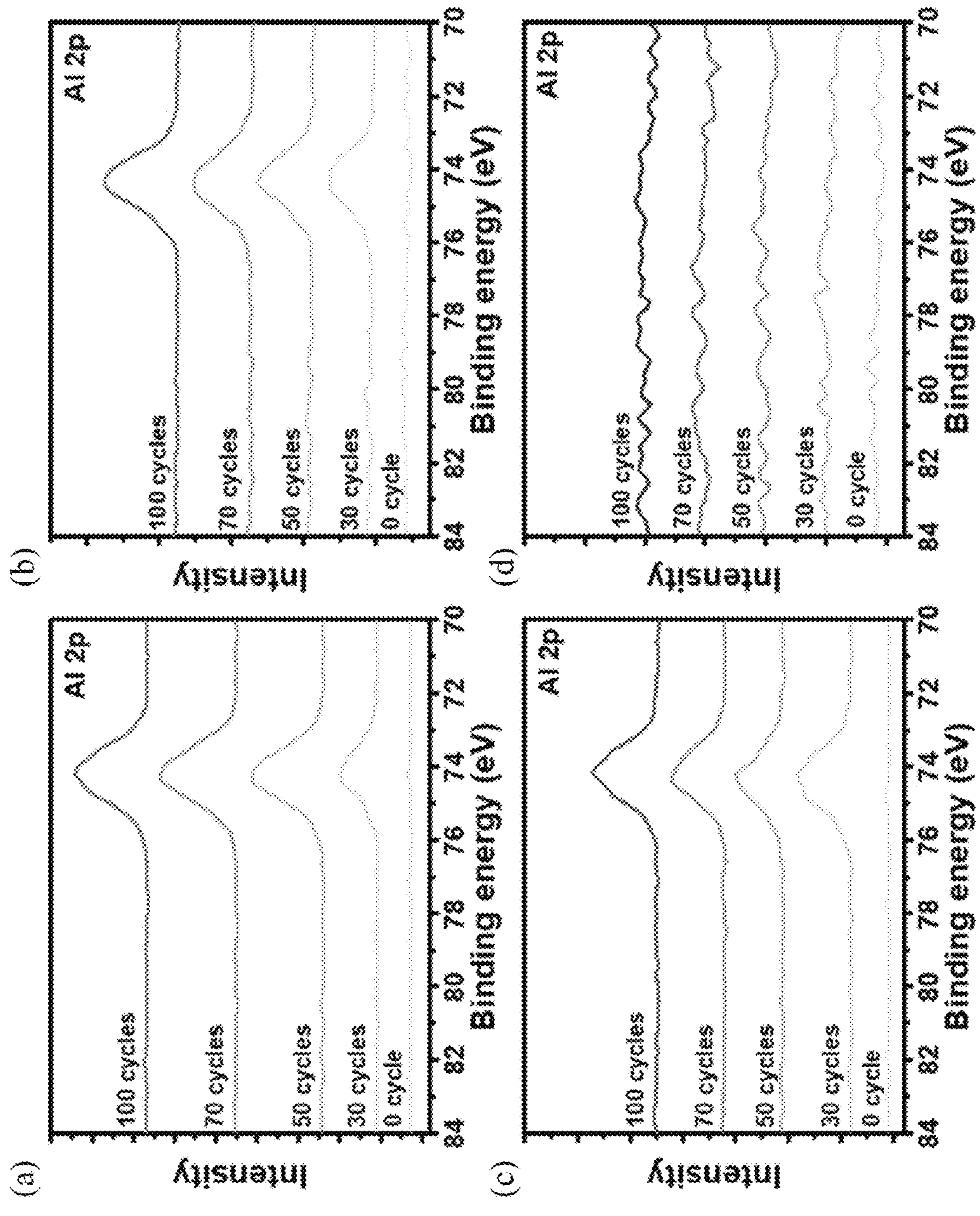
FIG. 10C shows synchrotron radiation photo emission spectroscopy (SPRES) diagrams of the binding energy of Al 2p of the aluminum oxide film deposited on the substrate including different compositions according to an embodiment of the present disclosure.

FIG. 10C shows synchrotron radiation photo emission spectroscopy (SPRES) diagrams of the binding energy of Al 2p of the aluminum oxide film deposited on the substrate including different compositions according to an embodiment of the present disclosure. Diagrams (a) and (b) show SPRES diagrams of the binding energy of Al 2p of the aluminum oxide film deposited on a silicon oxide substrate and a tungsten substrate, respectively, using an ALD method without using a plasma removal step (see FIG. 5) and a surface recovery step (see FIG. 9) with varied cycles (i.e., 0, 30, 50, 70, 100 cycles). Diagrams (c) and (d) show SPRES diagrams of the binding energy of Al 2p of the aluminum oxide film deposited on a silicon oxide substrate and a tungsten substrate, respectively, using an ALD method including using a plasma removal step and a surface recovery step with varied cycles (i.e., 0, 30, 50, 70, 100 cycles). Significant peaks in the diagrams (a), (b) and (c) indicate that aluminum oxide is formed on the corresponding substrates. No significant peak is present in the diagram (d). That is, by using the plasma removal step and the surface recovery step, no aluminum oxide would be formed on the tungsten substrate even if the number of the ALD cycles increases.

Figure 10D:
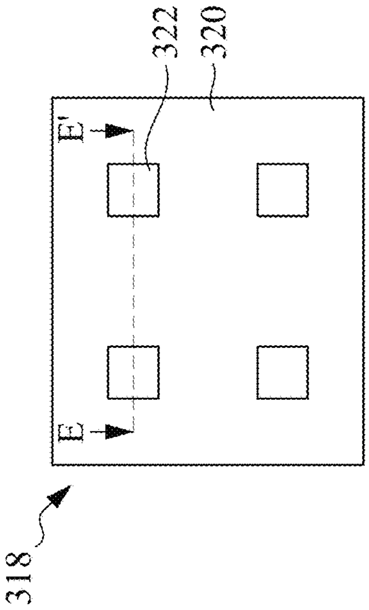
FIG. 10D is a top view of a workpiece having a silicon oxide region and a plurality of tungsten regions after performing an ALD method including using the plasma removal step and the surface recovery step to the workpiece to form an aluminum oxide film in accordance with some embodiments.
Figure 10E:
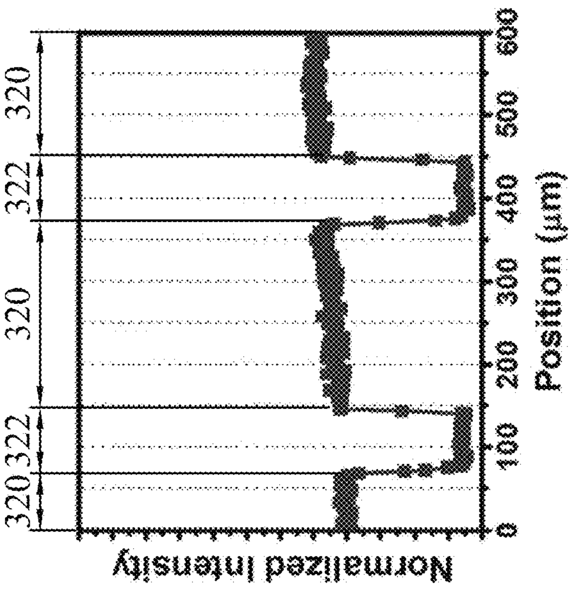
FIG. 10E is an aluminum atomic concentration along a scan-line E-E' of FIG. 10D.

FIG. 10D is a top view of a workpiece 318 having a silicon oxide region 320 and a plurality of tungsten regions 322 after performing an ALD method including using the plasma removal step (see FIG. 5) and the surface recovery step (see FIG. 9) to the workpiece 318 to form an aluminum oxide film in accordance with some embodiments. FIG. 10E is an aluminum atomic concentration along a scan-line E-E' of FIG. 10D. Here, the aluminum atomic concentration refers to the aluminum atomic concentration in the aluminum oxide film. The data in FIG. 10E shows that the aluminum oxide film is formed on the silicon oxide region 320 but not on the tungsten regions 322. That is, by using the plasma removal step and the surface recovery step, no aluminum oxide would be formed on the tungsten regions 322.

Referring back to FIG. 10A, in some alternative embodiments, each of the first region 100A and the second region 100B may include an oxide, a nitride, a carbide, a metal compound, or a metal, which are materials compatible with processes in a semiconductor manufacturing facility. For example, the oxide may be $SiO_2$, $ZrO_2$, $HfO_2$, $TiO_2$, $Al_2O_3$, or $VO_x$, or the like. The nitride may be AlN, SiN, SiCN, SiOCN, or the like. The carbide may be SiC, WC, graphite, or the like. The metal compound may be TaN, TiN, or the like. The metal may be W, Ru, Co, Cu, Al, Cr, Ni, Ti, or the like, excluding Au, Ag and Pt.

In some other embodiments, the as-deposited film 316 may include a dielectric (e.g., an oxide or a nitride) or a metal, which are materials compatible with processes in a semiconductor manufacturing facility. For example, the oxide may be $Al_2O_3$, $ZrO_2$, $HfO_2$, $TiO_2$, $SiO_2$, $MnO_x$, $MoO_3$, or the like. The nitride may be AlN, ZrN, HfN, TiN, SiN, or the like. The metal may be W, Ru, Cu, Co, Mn, Mo, or the like.

In some embodiments where the as-deposited film 316 includes Zr (e.g., $ZrO_2$), the first precursor 302 (see FIG. 3) can include Tetrakis(dimethylamido)zirconium (TDMAZ), Tetrakis(ethylmethylamido)zirconium (TEMAZ), $ZrCl_4$, the like, or a combination thereof. In some embodiments where the as-deposited film 316 includes Ti (e.g., $TiO_2$, TiN), the first precursor 302 (see FIG. 3) can include Tetrakis(dimethylamido)titanium (TDMAT), Tetrakis(ethylmethylamido)titanium (TEMAT), $TiCl_4$, the like, or a combination thereof. In some embodiments where the as-deposited film 316 includes Hf (e.g., $HfO_2$, HfN), the first precursor 302 (see FIG. 3) can include Tetrakis(dimethylamido)hafnium (TDMAH), Tetrakis(ethylmethylamido)titanium (TEMAH), $HfCl_4$, the like, or a combination thereof. In some embodiments where the as-deposited film 316 includes A1 (e.g., $Al_2O_3$, AlN), the first precursor 302 (see FIG. 3) can include Trimethylaluminum(TMA), Triethylaluminium(TEA), Tetrakis(dimethylamido) aluminum (TDMAA), the like, or a combination thereof. In some embodiments where the as-deposited film 316 includes Si (e.g., $SiO_2$, SiN), the first precursor 302 (see FIG. 3) can include (3-Aminopropyl) triethoxysilane, N-sec-Butyl(trimethyl silyl)amine, Tris(dimethylamino)silane (TDMAS), Tetraethyl orthosilicate (TEOS), $SiCl_4$, Tris(tert-butoxy)silanol(TBS), Tris(tert-pentoxy)silano(TPS), the like, or a combination thereof. In some embodiments where the as-deposited film 316 includes tungsten, the first precursor can include Bis(tert-butylimino) bis(tert-butylamino)tungsten, Bis(tert-butylimino)bis(dimethylamino)tungsten, Bis(cyclopentadienyl)tungsten, Bis (isopropylcyclopentadienyl)tungsten, Tungsten hexacarbonyl, the like, or a combination thereof. In some embodiments where the as-deposited film 316 includes Ru, the first precursor 302 (see FIG. 3) can include Bis(cyclopentadienyl)ruthenium, Bis(ethylcyclopentadienyl)ruthenium, Triruthenium dodecacarbonyl, the like, or a combination thereof. In some embodiments where the as-deposited film 316 includes Cu, the first precursor 302 (see FIG. 3) can be Copper bis(6,6,7,7,8,8,8-heptafluoro-2,2-dimethyl-3,5-octanedionate) or the like. In some embodiments where the as-deposited film includes Co, the first precursor can be Bis(cyclopentadienyl)cobalt, Bis(ethylcyclopentadienyl)cobalt, the like, or a combination thereof. In some embodiments where the as-deposited film 316 includes Mn or $MnO_x$ the first precursor 302 (see FIG. 3) can include Mn(2,2,6,6-tetramethylheptane-3,5-dionate)$_3$ (Mn(thd)$_3$), Manganese (III) acetylacetonate (Mn(acac)$_3$), bis(ethylcyclopentadienyl)manganese (Mn(CpEt)$_2$), the like, or a combination thereof. In some embodiments where the as-deposited film 316 includes Mo or $MoO_3$, the first precursor 302 (see FIG. 3) can include $MoF_6$, $Mo(CO)_6$, Molybdenum Tetrakis(dimethylamide) (Mo(NMe$_2$)$_4$), the like, or a combination thereof.

In some embodiments where the as-deposited film 316 is the oxide, the second precursor 308 (see FIG. 7) can be $H_2O$ vapor, $O_3$, $O_2$, or a combination thereof. In some embodiments where the as-deposited film 316 is the nitride, the second precursor 308 (see FIG. 7) can be $N_2$ plasma, a mixture of $N_2$ and $H_2$ plasma, or NH 3 plasma. In some embodiments, the second precursor 308 (see FIG. 7) can be $H_2$ plasma.

Figure 11B:
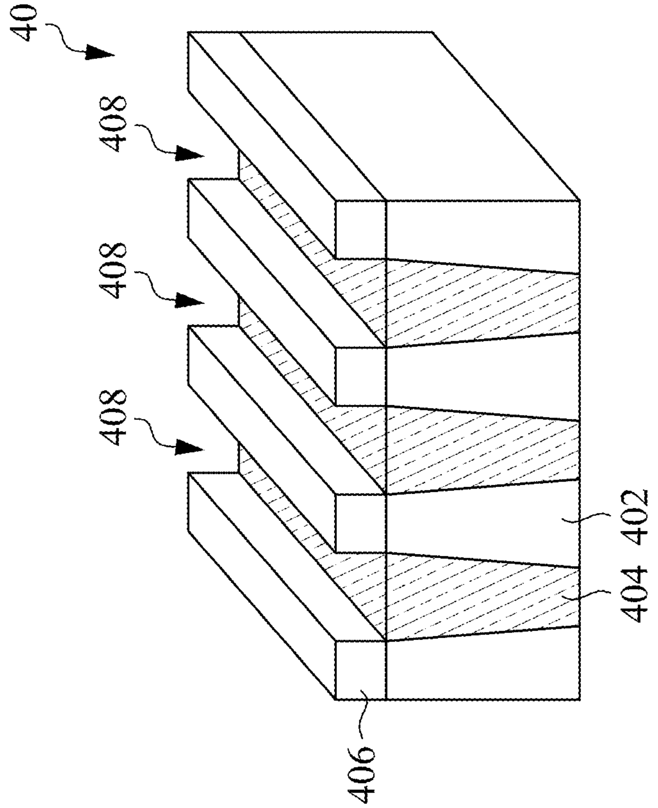
FIGS. 11A and 11B are cross-sectional views of a device at various intermediate stages of manufacture according to some embodiments.
Figure 11A:
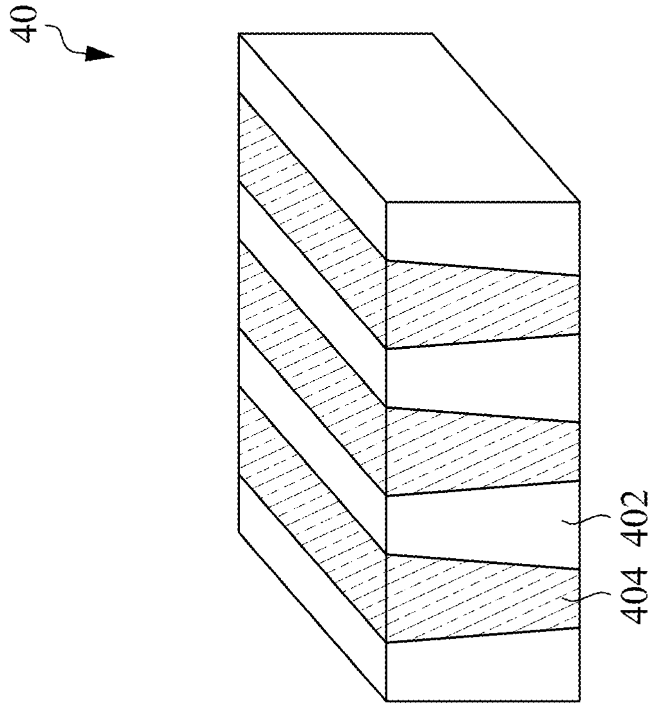

FIGS. 11A and 11B are cross-sectional views of a device 40 at various intermediate stages of manufacture according to some embodiments. Referring to FIG. 11A, the device 40 may include an inter-layer dielectric (ILD) layer 402 or inter-metal dielectric (IMD) layer with metallization patterns 404 formed over a substrate (not shown in FIGS. 11A and 11B). The ILD layer 402 is configured to provide isolation between the metallization patterns 404. The ILD layer 402 may be silicon oxide, fluorinated silica glass (FSG), carbon doped silicon oxide, tetra-ethyl-ortho-silicate (TEOS) formed oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The metallization patterns 404 may be aluminum, aluminum alloy, copper, copper alloy, titanium, titanium nitride, tantalum, tantalum nitride, tungsten, the like, and/or combinations thereof. Formation of the metallization patterns 404 and the ILD layer 402 may be a dual-damascene process and/or a single-damascene process.

The metallization patterns 404 and the ILD layer 402 include different compositions, and hence have high deposition selectivity therebetween. Referring to FIG. 11B, a film 406 is formed on the ILD layer 402 using an area-selective atomic layer deposition (AS-ALD) to form a plurality of fully self-aligned vias 408 over the metallization patterns 404 without using an additional mask, and hence a manufacturing cost is reduced. In other words, no additional lithography and etching processes are required to form the vias 408. The film 406 and the ILD layer 402 have bonds therebetween with a bonding energy greater than bonds between the film 406 and the metallization patterns 404. A top surface of the ILD layer 402 can be referred to as a growth area (GA), and a top surface of the metallization patterns 404 can be referred to as a non-growth area (NGA) for the film 406. The process details of the AS-ALD of forming the film 406 may be found in the embodiments shown in FIGS. 1A through 10A, and are not repeated herein.

Figure 12A:
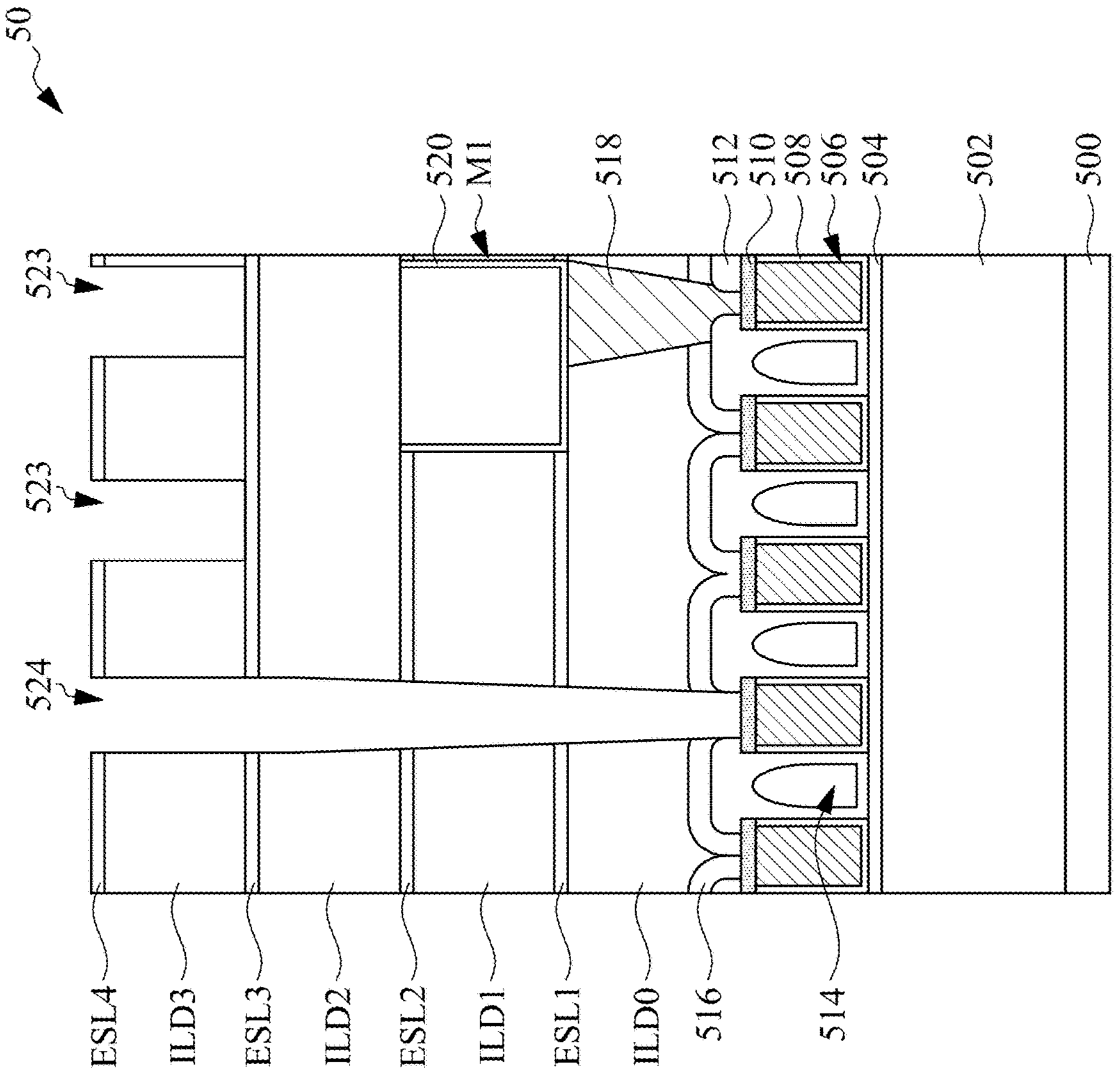
FIGS. 12A-12C are cross-sectional views of an integrated circuit at various stages of fabrication according to various aspects of the present disclosure.
Figure 12B:
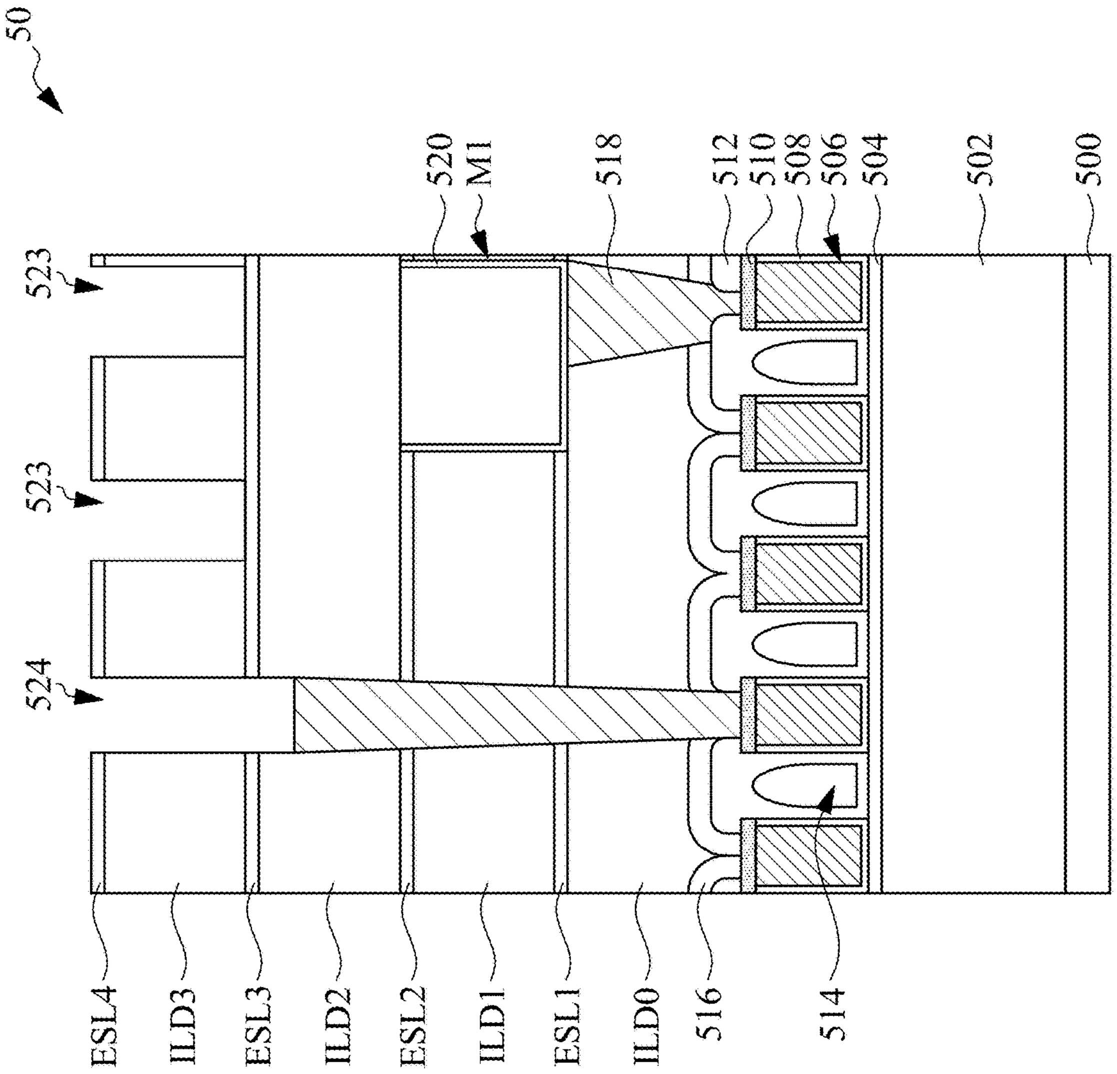
Figure 12C:
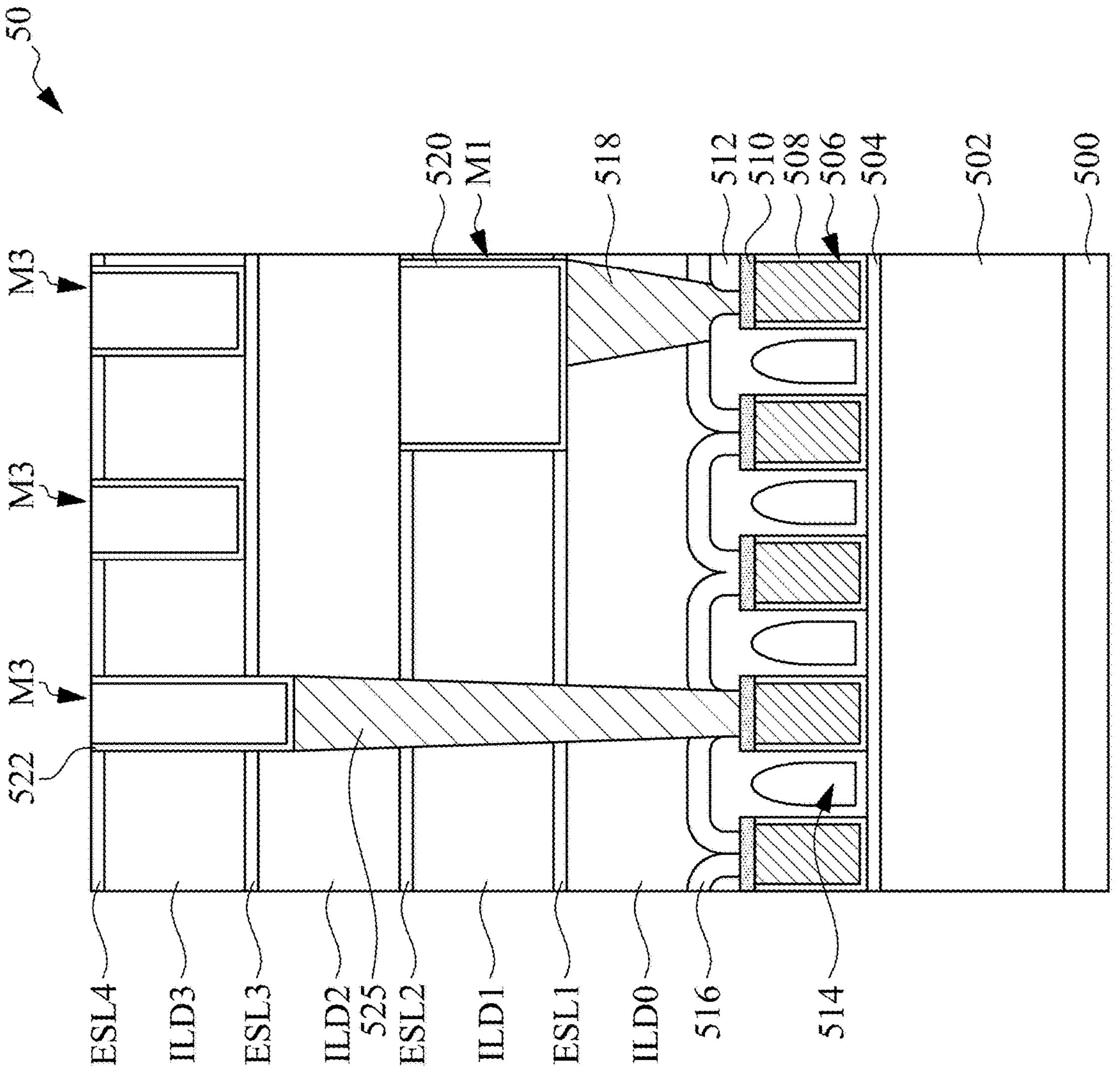

FIGS. 12A-12C are cross-sectional views of an integrated circuit 50 at various stages of fabrication according to various aspects of the present disclosure. Referring to FIG. 12A, a dielectric layer 502 is formed over a substrate 500. The substrate 500 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 500 may be a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 500 may be doped with a p-type dopant, such as boron, aluminum, gallium, or the like, although the substrate 500 may alternatively be doped with an n-type dopant, as is known in the art. The dielectric layer 502 may include a material similar to the material of the ILD layer 402.

The substrate 500 may include active and passive devices (not shown). As one of ordinary skill in the art will recognize, a wide variety of devices such as transistors, capacitors, resistors, inductors, combinations of these, and the like may be used to generate the structural and functional requirements of the design for the integrated circuit 50. Only a portion of the substrate 500 is illustrated in the figures, as this is sufficient to fully describe the illustrative embodiments.

In some embodiments, an etch stop layer 504 is formed over the dielectric layer 502. In some embodiments, the etch stop layer 504 functions for controlling the end point during subsequent etching processes. In some embodiments, the etch stop layer 504 is formed of silicon oxide, silicon nitride, silicon carbide, silicon oxynitride or combinations thereof. The etch stop layer 504 is formed through any of a variety of deposition techniques, including low-pressure chemical vapor deposition (LPCVD), atmospheric-pressure chemical vapor deposition (APCVD), plasma-enhanced chemical vapor deposition (PECVD), physical vapor deposition (PVD), or sputtering.

After the etch stop layer 504 is formed, conductive features 506 are formed on the etch stop layer 504. In some embodiments, the conductive features 506 are conductive lines. The conductive features 506 can be metal-x ($M_x$) level interconnects (e.g., metal line). For example, "x" may be 0, 1, 2, and so on. The conductive features 506 may include a barrier layer 508 including titanium, titanium nitride, tantalum, tantalum nitride, or the like, and may be formed using physical vapor deposition (PVD), chemical vapor deposition (CVD), atomic layer deposition (ALD) or the like. The conductive features 506 may include aluminum, aluminum alloy, copper, copper alloy, titanium, titanium nitride, tantalum, tantalum nitride, tungsten, the like, and/or combinations thereof. A capping layer 510 is formed over the conductive features 506 to improve the electro migration characteristics of the conductive features 506. In some embodiments, the capping layer 510 may be formed by a deposition process including low-pressure CVD (LPCVD), CVD, PECVD, plasma-enhanced ALD (PEALD), PVD, sputtering, the like, or a combination thereof. The capping layer 510, for example, is a metal-containing layer. In some embodiments, the capping layer 510 includes Co, Cu, W, Al, Mn, Ru, the like, or combinations and alloys thereof.

A filler dielectric material 512 is formed on the conductive features 506 and has air gaps 514 therein. The filler dielectric material 512 has a k value lower than an overlying etch stop layer 516. The k value of the filler dielectric material 512 is substantially close to a k value of the dielectric layer 502 and may be less than about 2.9. The filler dielectric material 512 and dielectric layer 502 may be formed of different materials, or substantially the same materials, but having different porosities, and hence different k values. In an exemplary embodiment, the filler dielectric material 512 may be composed of fluorosilicate glass (FSG), low-k dielectric materials, and extreme low-k dielectric materials.

As depicted, the integrated circuit 50 is fabricated including a plurality of interlayer dielectric (ILD) layers over the filler dielectric material and the conductive features. Four ILD layers, identified as ILD0 through ILD4 are depicted in FIG. 12A. The ILD layers ILD0-ILD4 may provide electrical insulation as well as structural support for the various features of the integrated circuit during many fabrication process steps. The ILD layers ILD0-ILD4 between two metallization layers may include etch stop layers, identified as ESL1-ESL4 therebetween to signaling the termination point of an etching process and protect any underlying layer or layers during the etching process.

A conductive via 518 penetrates through the ILD layer ILD0 and is in contact with the underlying conductive feature 506. A metallization layer M1 is on the conductive via 518 and includes a barrier layer 520. The barrier layer 520 is similar to the barrier layer 508 in terms of composition and formation method.

The etch stop layer ESL4 and the underlying ILD layer ILD4 are etched to form vias 523. In some embodiments, the etch stop layers ESL1-ESL4 and 516 and the ILD layers ILD0-ILD3 are etched to form a supervia 524 which crossing more than one ILD layer. The capping layer 510 on one of the conductive features 506 is exposed by the supervia 524.

The etch stop layer ESL3 and the capping layer 510 include different compositions, and hence have high deposition selectivity therebetween. Referring to FIG. 12B, a conductive via 526 is formed on the capping layer 510 exposed by the supervia 524 using an area-selective atomic layer deposition (AS-ALD) to form a self-aligned conductive via 525 without using an additional mask, and hence a manufacturing cost is reduced. In other words, no additional lithography and etching process are required to form the conductive via 525. The conductive via 525 and the capping layer 510 have bonds therebetween with a bonding energy greater than bonds between the conductive via 525 and the etch stop layer ESL3. The exposed capping layer 510 can be referred to as a growth area (GA), and the etch stop layer ESL3 can be referred to as a non-growth area (NGA) for the conductive via 525. The process details of the AS-ALD may be found in the embodiments shown in FIGS. 1A through 10A, and are not repeated herein.

Referring to FIG. 12C, a metallization layer M3 is formed in the supervia 524 and the vias. The metallization layer M3 includes a barrier layer 522. The barrier layer 522 is similar to the barrier layer 508 in terms of composition and formation method. The metallization layer M3 can be formed by overfilling a remaining space of the supervia 524 and the vias 523 using physical vapor deposition (PVD), chemical vapor deposition (CVD), atomic layer deposition (ALD) or the like followed by a chemical mechanical polishing (CMP) process to remove an excess portion thereof over the top surface of the etch stop layer ESL4.

Figure 13A:
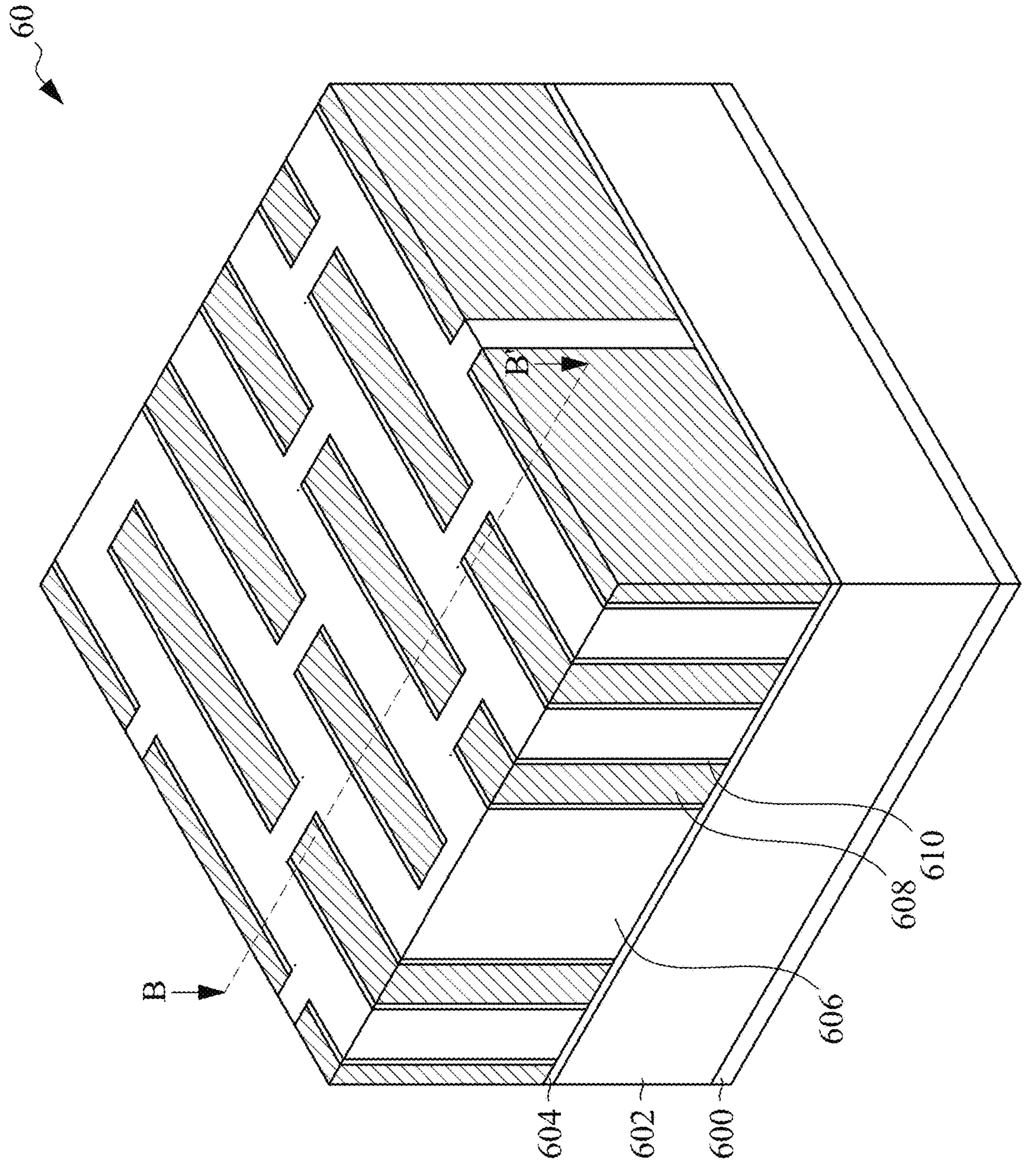
FIGS. 13A, 14A, 15A, 16A and 17A are perspective views of an integrated circuit at various stages of fabrication according to various aspects of the present disclosure.
Figure 13B:
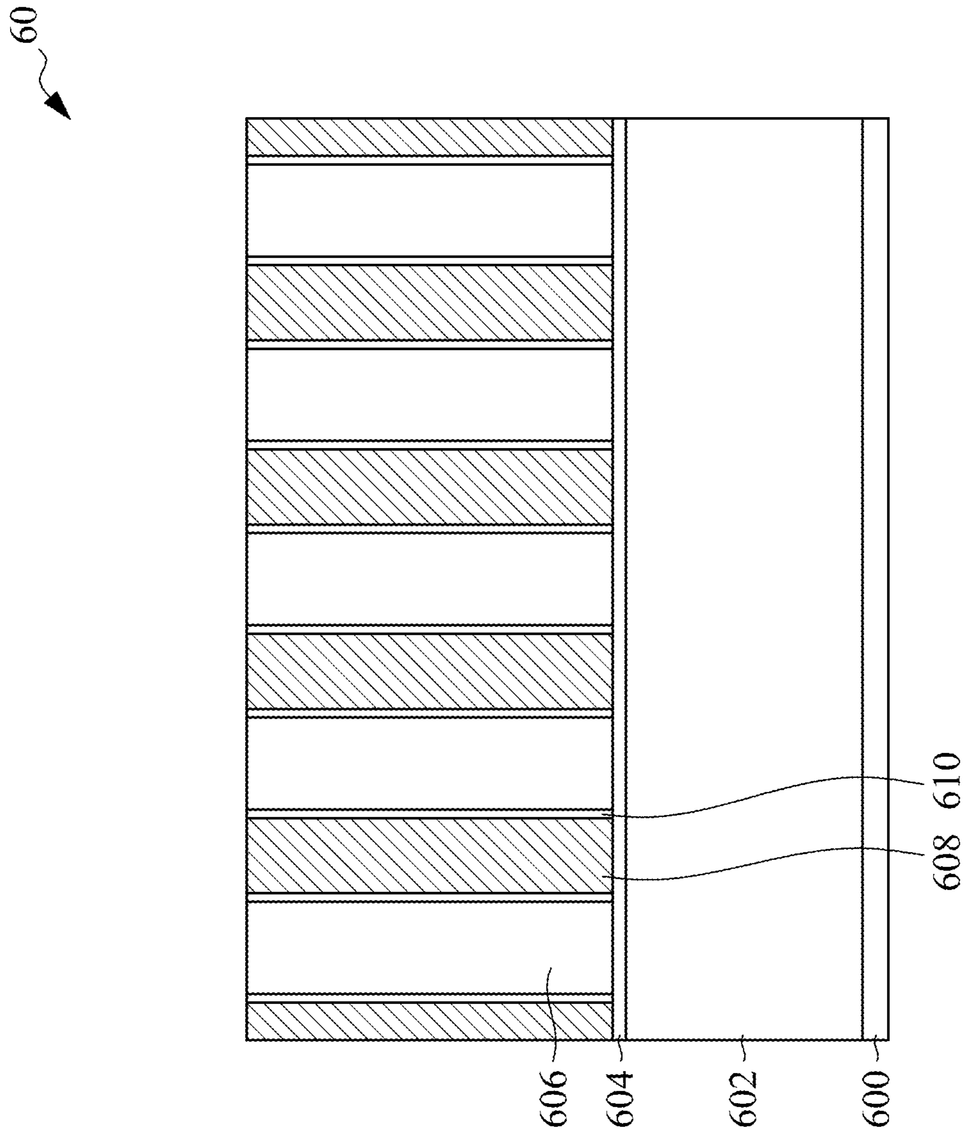
FIGS. 13B, 14B, 15B, 16B and 17B are cross-sectionals views taken along line B-B' in FIGS. 13A, 14A, 15A, 16A and 17A, respectively.

FIGS. 13A, 14A, 15A, 16A and 17A are perspective views of an integrated circuit 60 at various stages of fabrication according to various aspects of the present disclosure. FIGS. 13B, 14B, 15B, 16B and 17B are cross-sectionals views taken along line B-B' in FIGS. 13A, 14A, 15A, 16A and 17A, respectively. In FIGS. 13A and 13B, a dielectric layer 602 and an etch stop layer 604 are formed on a substrate 600 in sequence. The dielectric layer 602, the etch stop layer 604 and the substrate 600 are similar to the etch stop layer 516, the dielectric layer 502 and the substrate 500 as discussed above with reference to FIG. 12A.

The integrated circuit 60 may include a dielectric layer 606 with conductive features 608 formed over the etch stop layer 604. In some embodiments, the conductive features 608 are conductive lines. The conductive features can be metal-x ($M_x$) level interconnects (e.g., metal line). For example, "x" may be 0, 1, 2, and so on. The conductive features 608 may include a barrier layer 610 including titanium, titanium nitride, tantalum, tantalum nitride, or the like. The conductive features 608 are similar to the conductive features 506 of FIG. 12A in terms of composition and formation method. The dielectric layer 606 may be a single layer or a multi-layered structure. The dielectric layer 606 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 606 may be deposited by chemical vapor deposition (CVD), physical vapor deposition (PVD), atomic layer deposition (ALD), a spin-on-dielectric (SOD) process, the like, or a combination thereof. The conductive features 608 have top surfaces being substantially coplanar with a top surface of the dielectric layer 606.

Figure 14A:
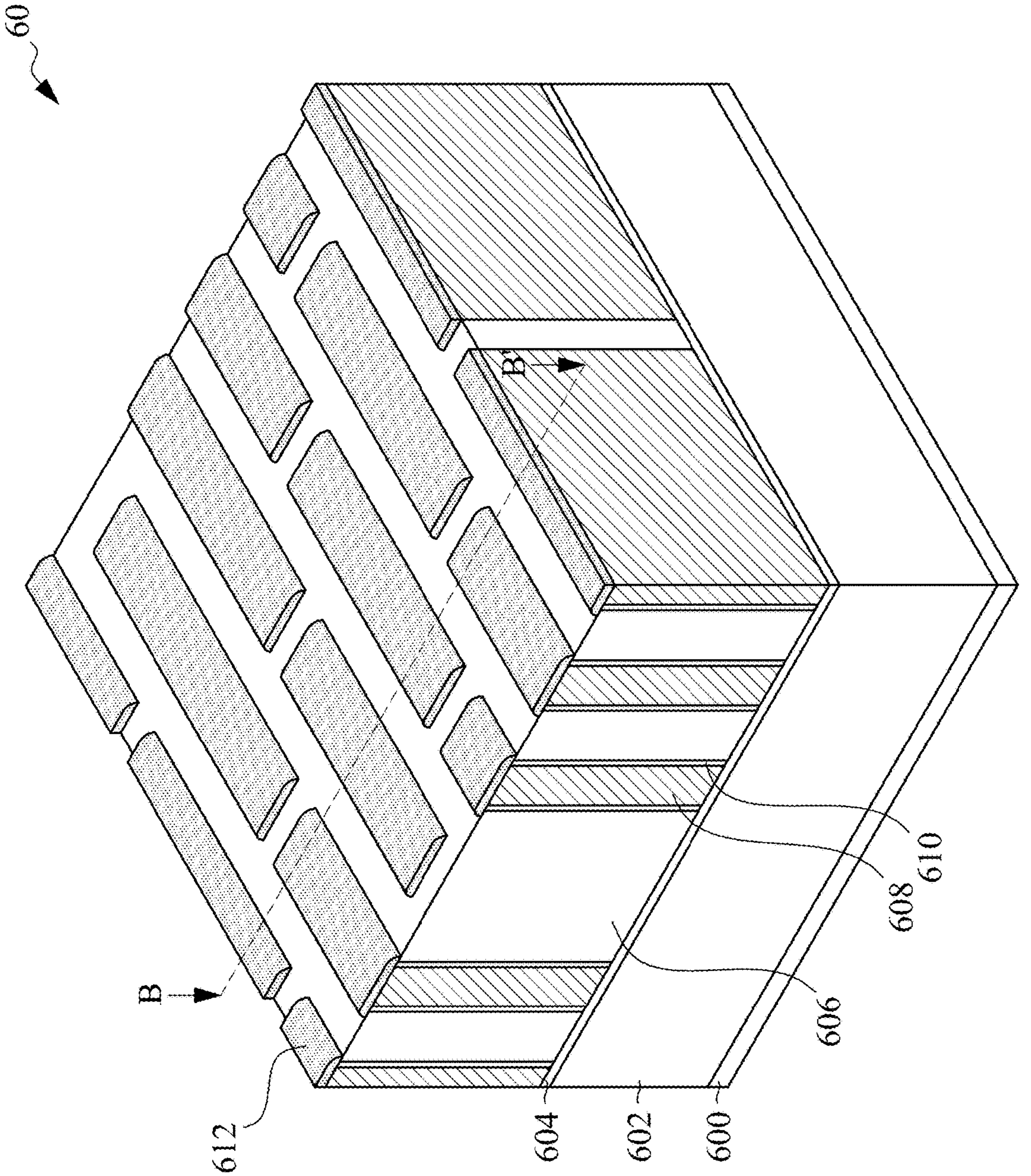
Figure 14B:
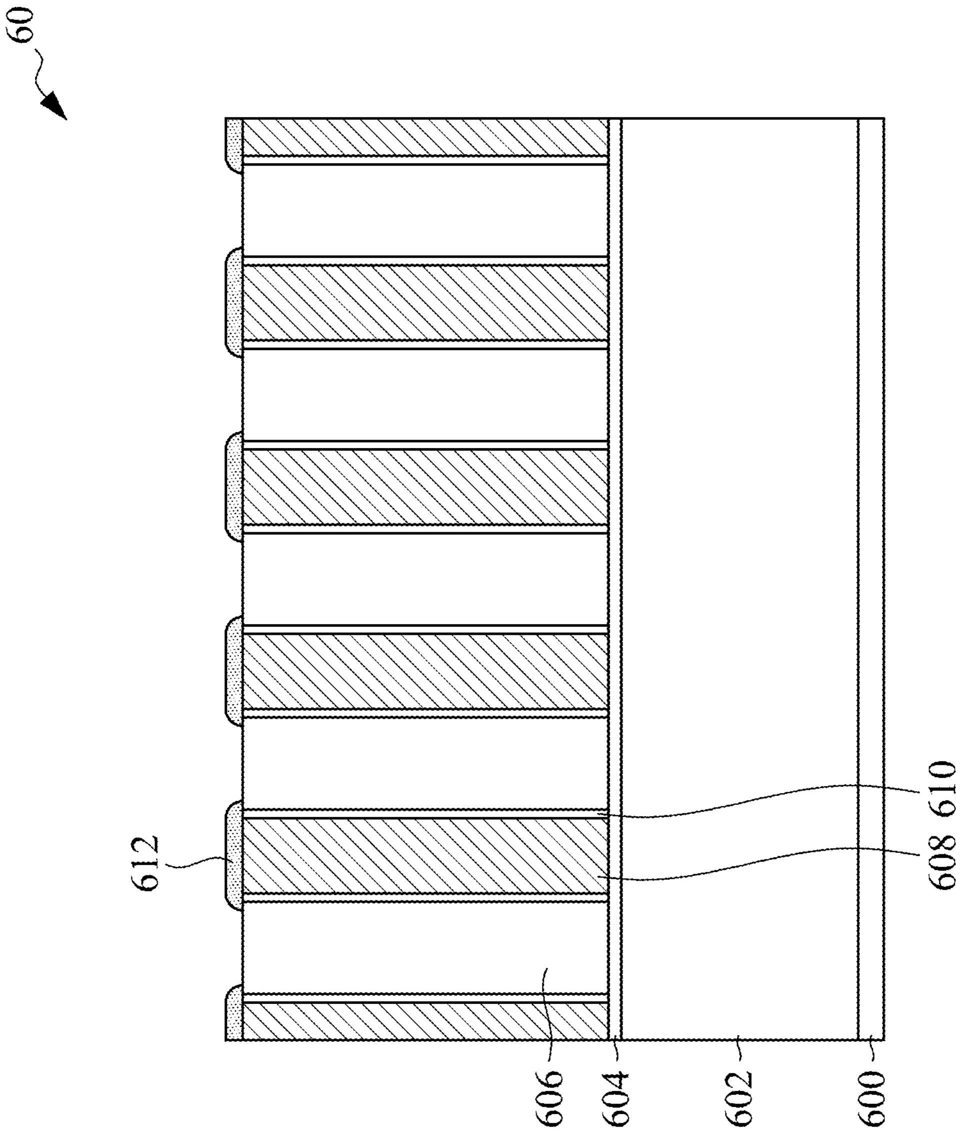

The conductive features 608 and the dielectric layer 606 include different compositions, and hence have high deposition selectivity therebetween. Referring to FIGS. 14A and 14B, a capping layer 612 is formed over the conductive features 608 using an area-selective atomic layer deposition (AS-ALD) without using an additional mask, and hence a manufacturing cost is reduced. The conductive features 608 and the capping layer 612 have bonds therebetween with a bonding energy greater than bonds between the capping layer 612 and the dielectric layer 606. In other words, no additional lithography and etching process are required. The top surfaces of the conductive features 608 can be referred to as a growth area (GA), while the top surface of the dielectric layer 606 can be referred to as a non-growth area (NGA). The process details of the AS-ALD may be found in the embodiments shown in FIGS. 1A through 10A, and are not repeated herein.

The capping layer 612 includes a conductive material such as a metal-containing layer. In some embodiments, the capping layer 612 includes cobalt, copper, tungsten, aluminum, manganese, ruthenium, tantalum, combinations of these, alloys thereof, or the like, to improve the electro migration of the conductive features.

Figure 15A:
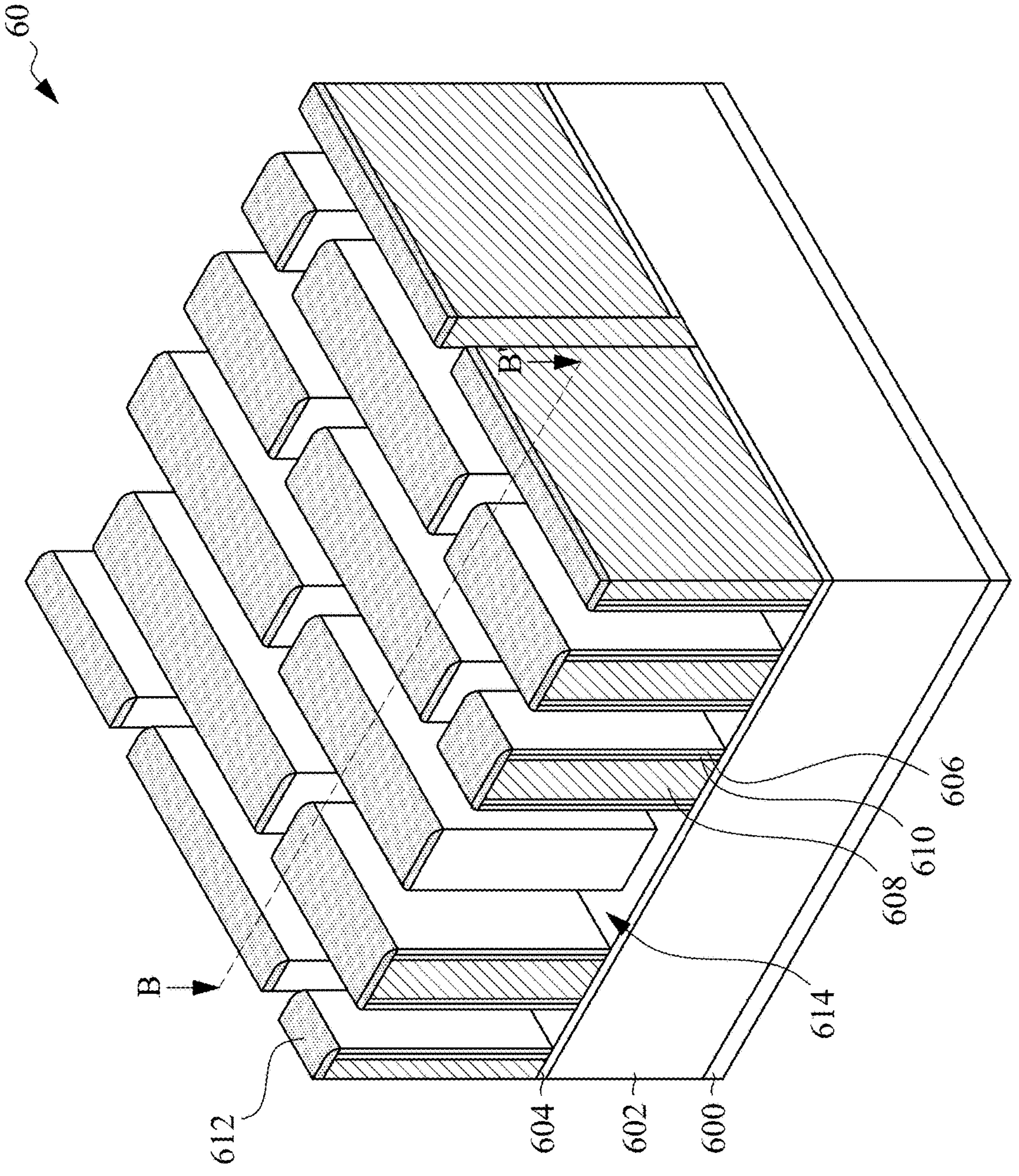
Figure 15B:
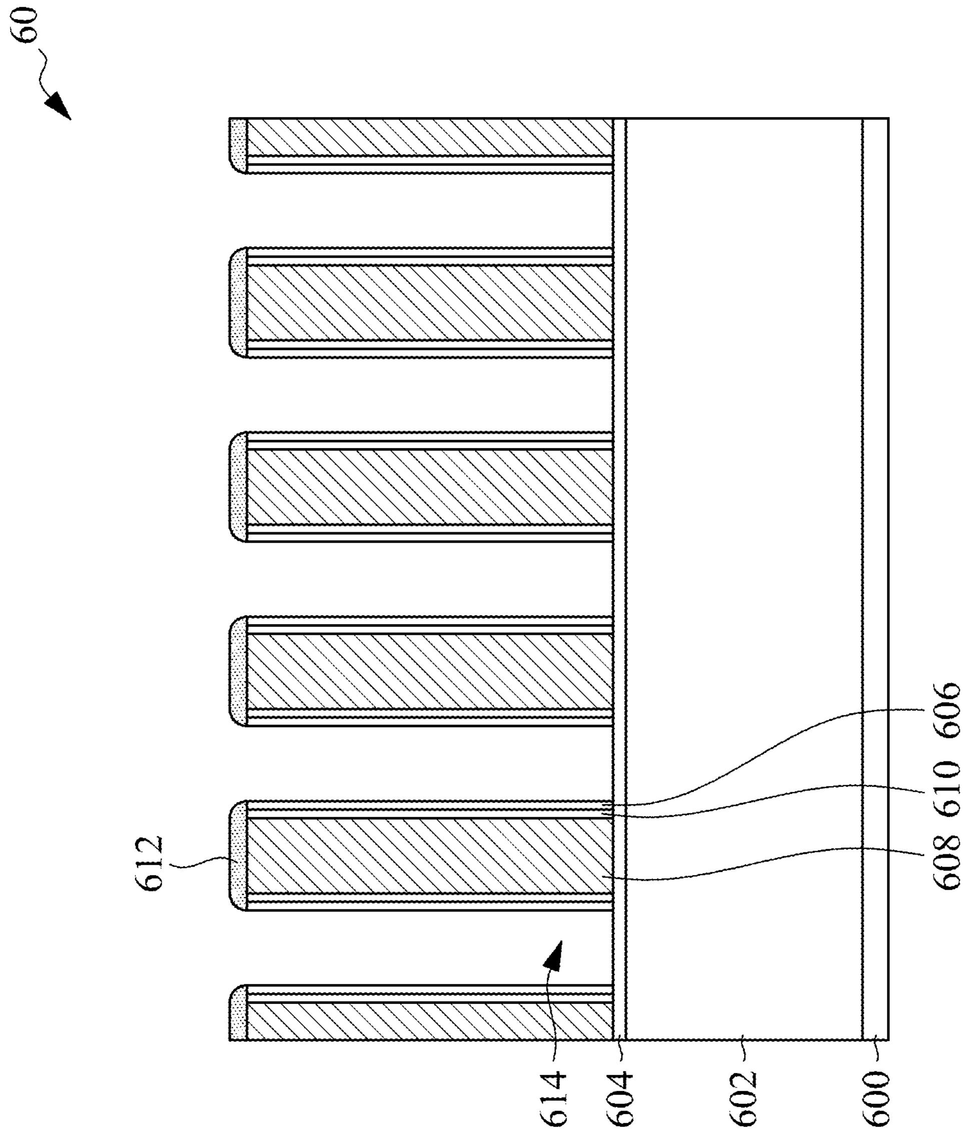

Referring to FIGS. 15A and 15B, the dielectric layer 606 is removed using a suitable process including photolithography and etch processes. The photolithography process may include forming a photoresist layer over the dielectric layer 606 and the capping layer 612, exposing the photoresist layer to a pattern, performing a post-exposure bake process, and developing the photoresist layer to form a patterned photoresist layer. The patterned photoresist layer then be used to protect the capping layer 612, while an etch process forms trenches 614 through the dielectric layer 606, thereby leaving the capping layer 612 and the underlying conductive features 608. The etch stop layer 604 is exposed by the trenches 614. The trenches 614 may be etched using a dry etch (e.g., reactive ion etching), a wet etch, or a combination thereof.

Figure 16A:
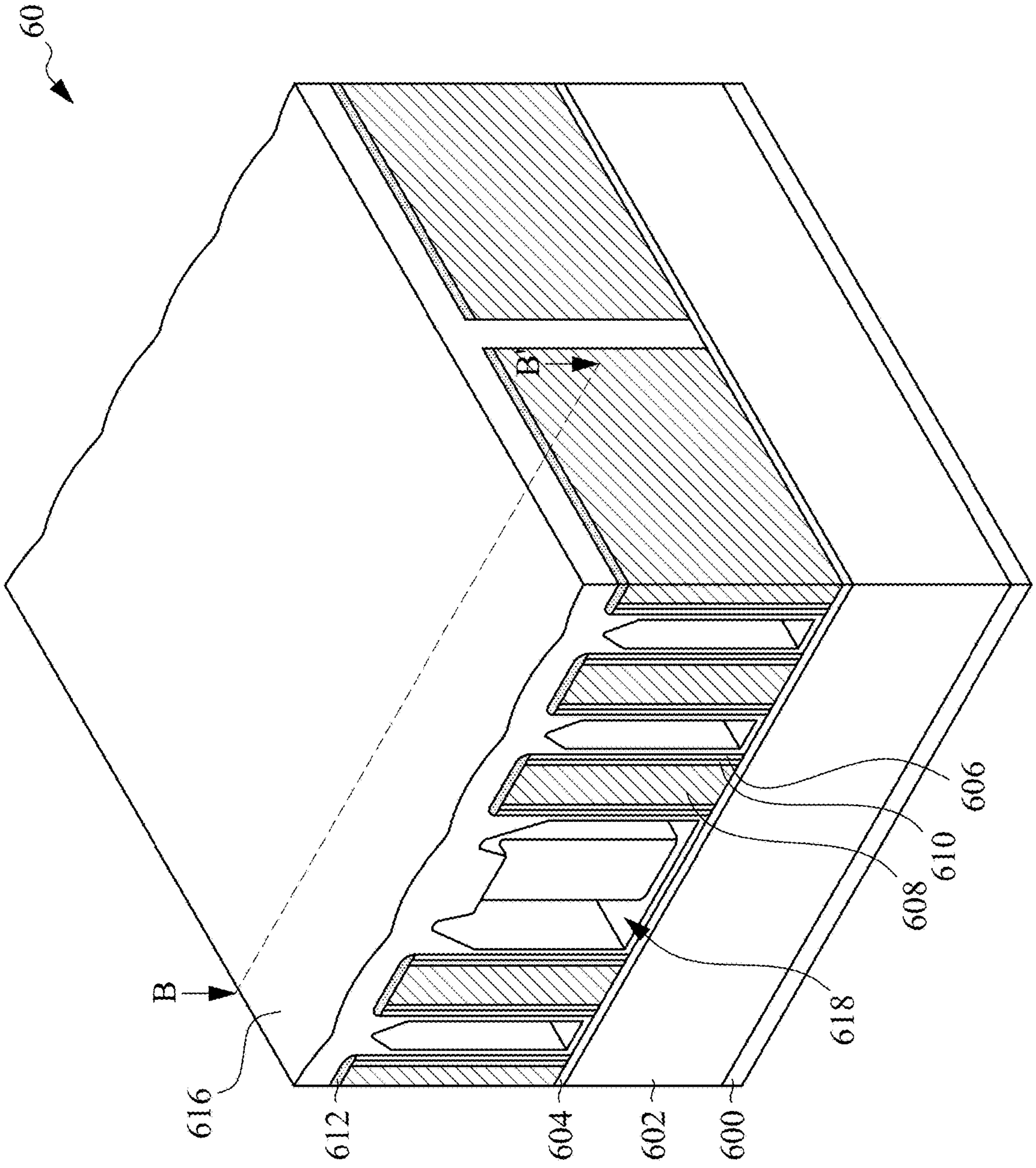
Figure 16B:
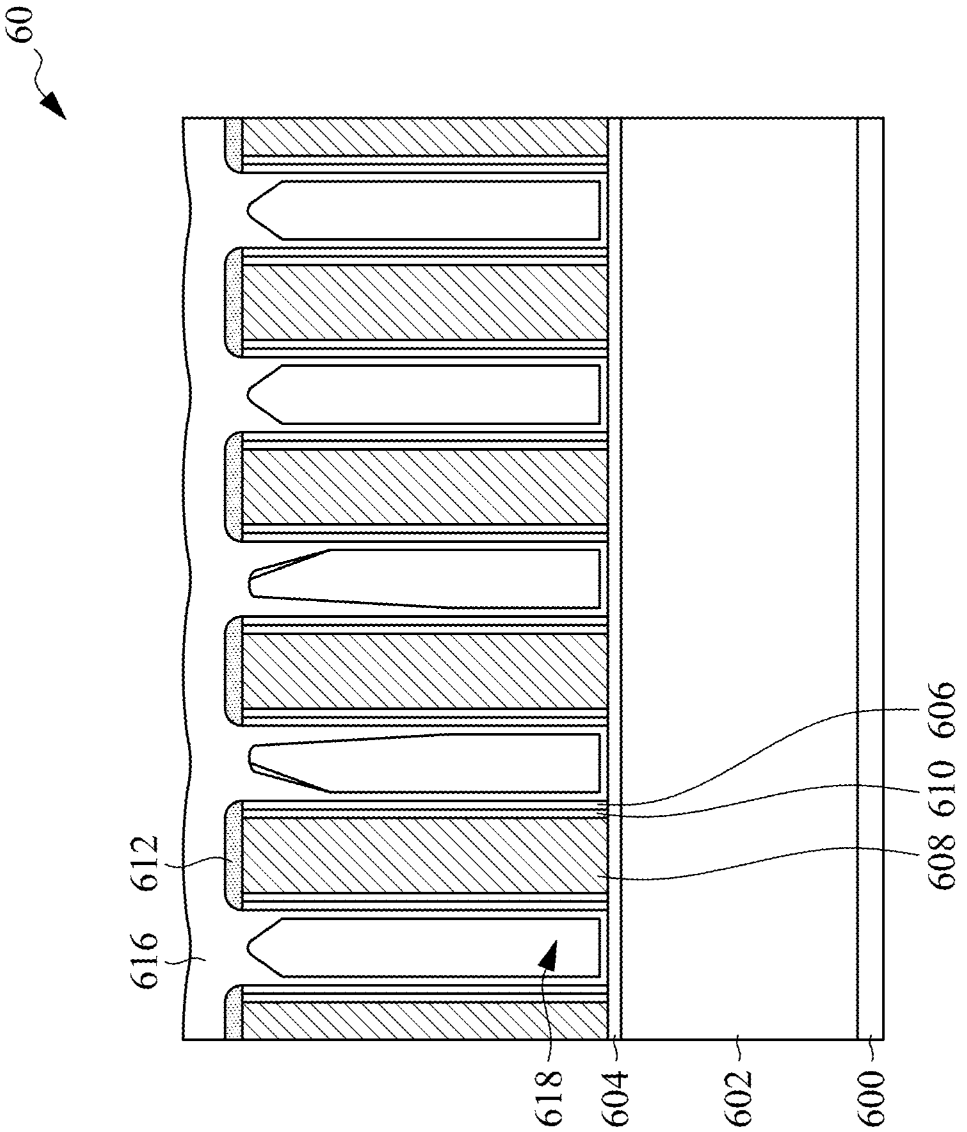

Referring to FIGS. 16A and 16B, a fill dielectric material 616 is formed on the capping layer 612 and fills into the trenches 614. The fill dielectric material 616 is formed using a deposition process such as a chemical vapor deposition process in some embodiments.

Depending on a dimension of the trenches 614, a deposition rate of the deposition process is tuned such that the fill dielectric material 616 would not completely fill the trenches 614 (see FIG. 15A) and hence form a plurality of desired air gaps 618 between the adjacent conductive features 608.

In some embodiments, the fill dielectric material 616 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

Figure 17A:
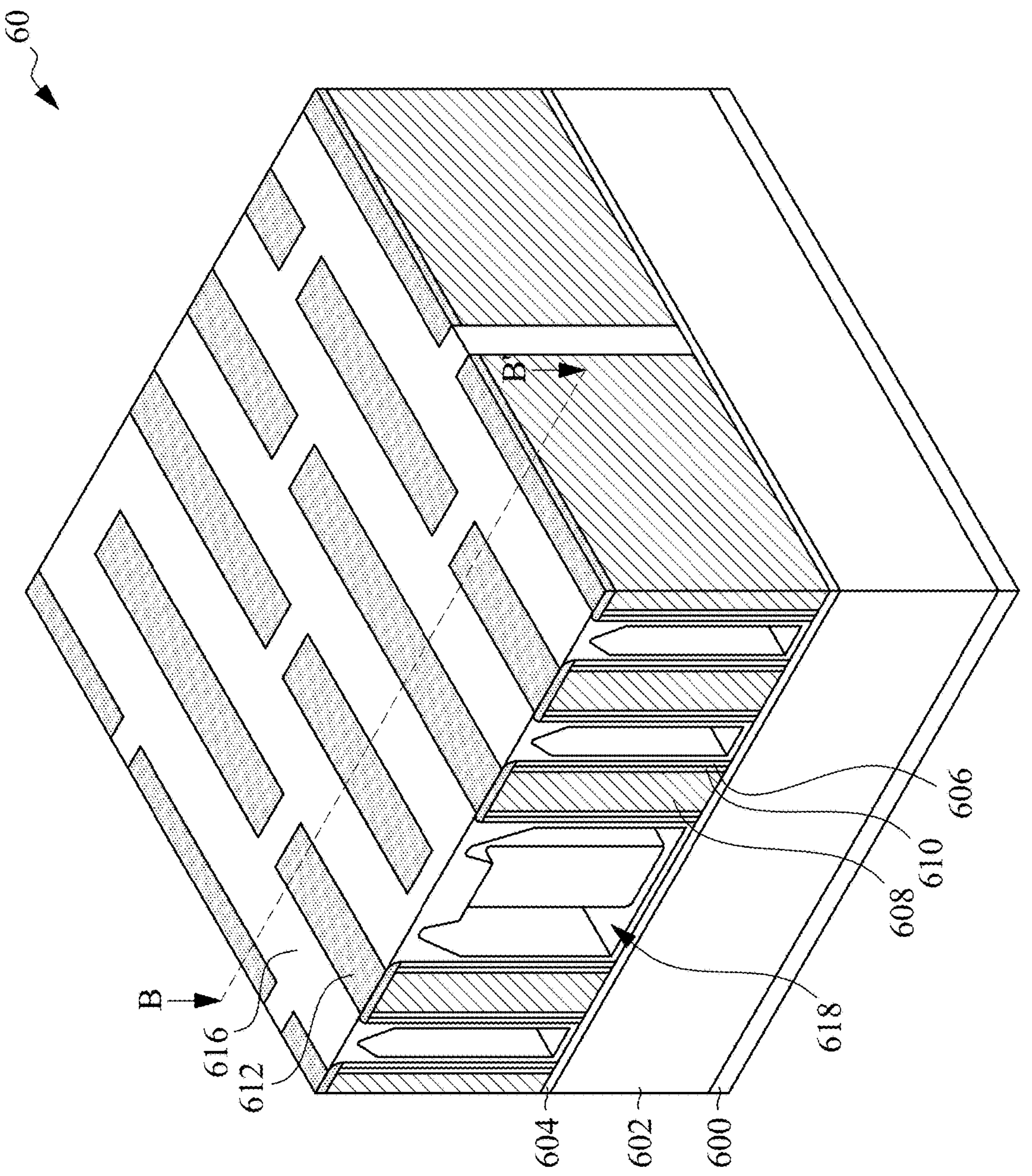
Figure 17B:
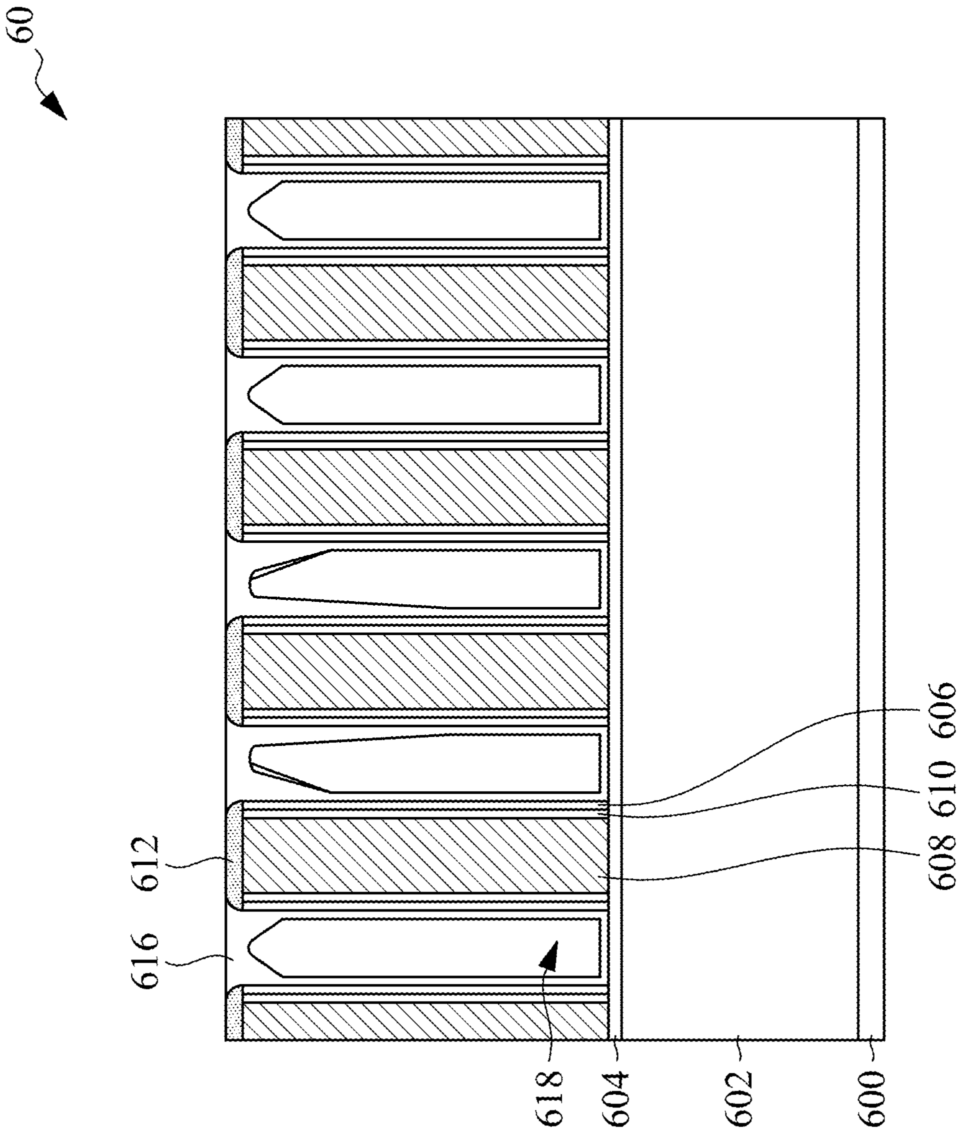

In FIGS. 17A and 17B, an excess portion of the fill dielectric material 616 is removed, exposing the capping layer 612. In some embodiments, the fill dielectric material 616 is removed using a CMP process. The CMP process removes the fill dielectric material 616 over the top surface of the capping layer 612 such that the top surface of the fill dielectric material 616 and the capping layer 612 may be substantially coplanar with each other. Tops of the air gaps 618 are sealed by the remaining fill dielectric material 616. The air gaps 618 contribute to a reduction in parasitic capacitance.

FIGS. 18A-18J are perspective views of a method for manufacturing a semiconductor structure 70 at various stages in accordance with some embodiments of the present disclosure. These embodiments are discussed below in the context of forming the semiconductor structure 70 such as a FinFET transistor having a single fin or multiple fins on a bulk silicon substrate. In some embodiments, the semiconductor structure 70 shown in FIG. 18A may be an intermediate device fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 18A:
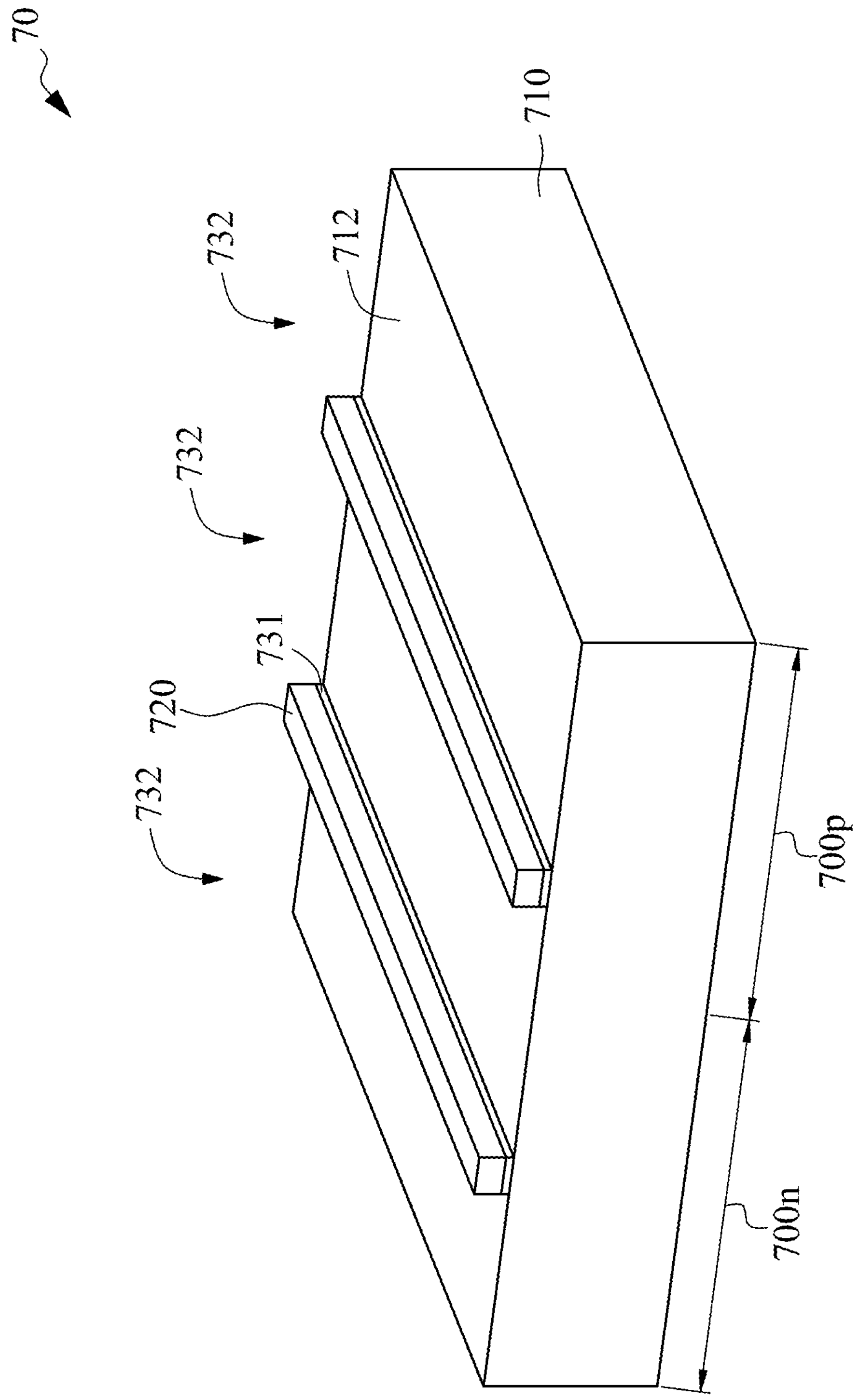
FIGS. 18A-18J are perspective views of a method for manufacturing a semiconductor structure at various stages in accordance with some embodiments of the present disclosure.

Reference is made to FIG. 18A. A substrate 710 is provided. The substrate 710 includes an n-type region **700*n* and a p-type region 700*p*. N-type devices (such as NFETs) will be formed on the n-type region 700*n*, and p-type devices (such as PFETs) will be formed on the p-type region 700*p*. In some embodiments, the substrate 710 may include silicon (Si). Alternatively, the substrate 710 may include germanium (Ge), silicon germanium, gallium arsenide (GaAs), or other appropriate semiconductor materials. In some alternative embodiments, the substrate 710 may include an epitaxial layer. Furthermore, the substrate 710** may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A mask layer 720 (may be a hard mask layer) is formed over the top surface 712 of the substrate 710. In some embodiments, the mask layer 720 includes nitride. For example, the mask layer 720 is made of silicon nitride (SiN). However, other materials, such as SiON, silicon carbide, or combinations thereof, may also be used. The mask layer 720 may be formed by a process such as CVD, PECVD, LPCVD, or the like. Alternatively, the mask layer 720 may be made of a silicon oxide and then converted to SiN by nitridation.

In some embodiments, a protective layer 731 is formed over the top surface 712 of the substrate 710 and between the mask layer 720 and the substrate 710. The protective layer 731 protects the top surface 712 from direct contact with the mask layer 720. For example, the protective layer 73 can protect active regions formed in the substrate 710. The active regions are used for forming devices (such as transistors, resistors, etc.). Depending upon the devices to be formed, the active regions may include either an n-well or a p-well as determined by the design conditions. In some embodiments, the protective layer 731 is made of a thermal oxide. Once formed, the mask layer 720 and the protective layer 731 are patterned through suitable photolithographic and etching processes to form openings 732 over the top surface 712.

Figure 18B:
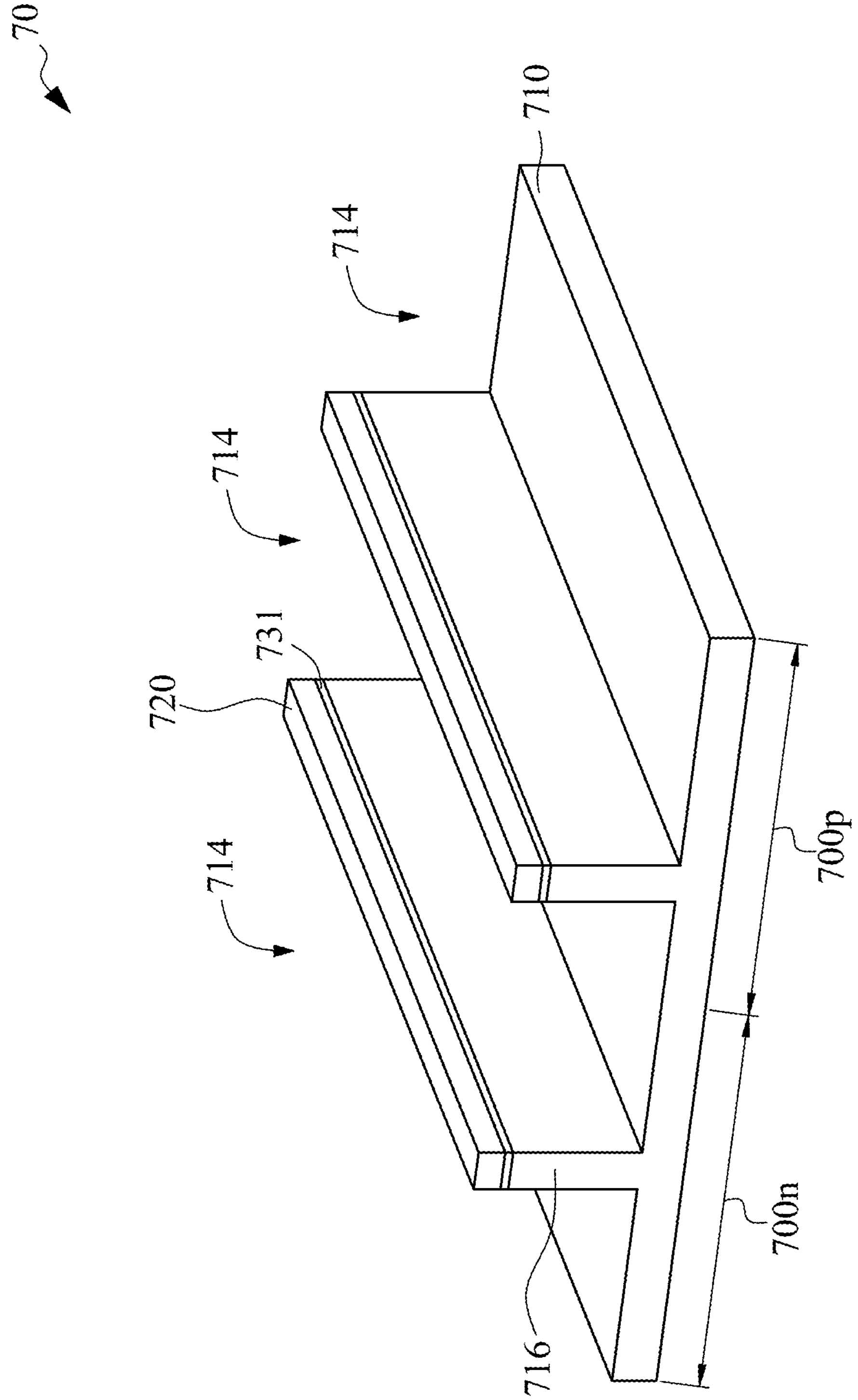

Reference is made to FIG. 18B. The exposed portions of the substrate 710 through the openings 732 (see FIG. 18A) are removed by an etching process, such as reactive ion etching (RIE), in order to form the trenches 714 in the substrate 710. In some embodiments, the substrate 710 is etched to form semiconductor fins 716, and the trenches 714 are configured to separate adjacent two semiconductor fins 716. In other words, one of the semiconductor fins 716 is between adjacent two of the trenches 714.

Figure 18C:
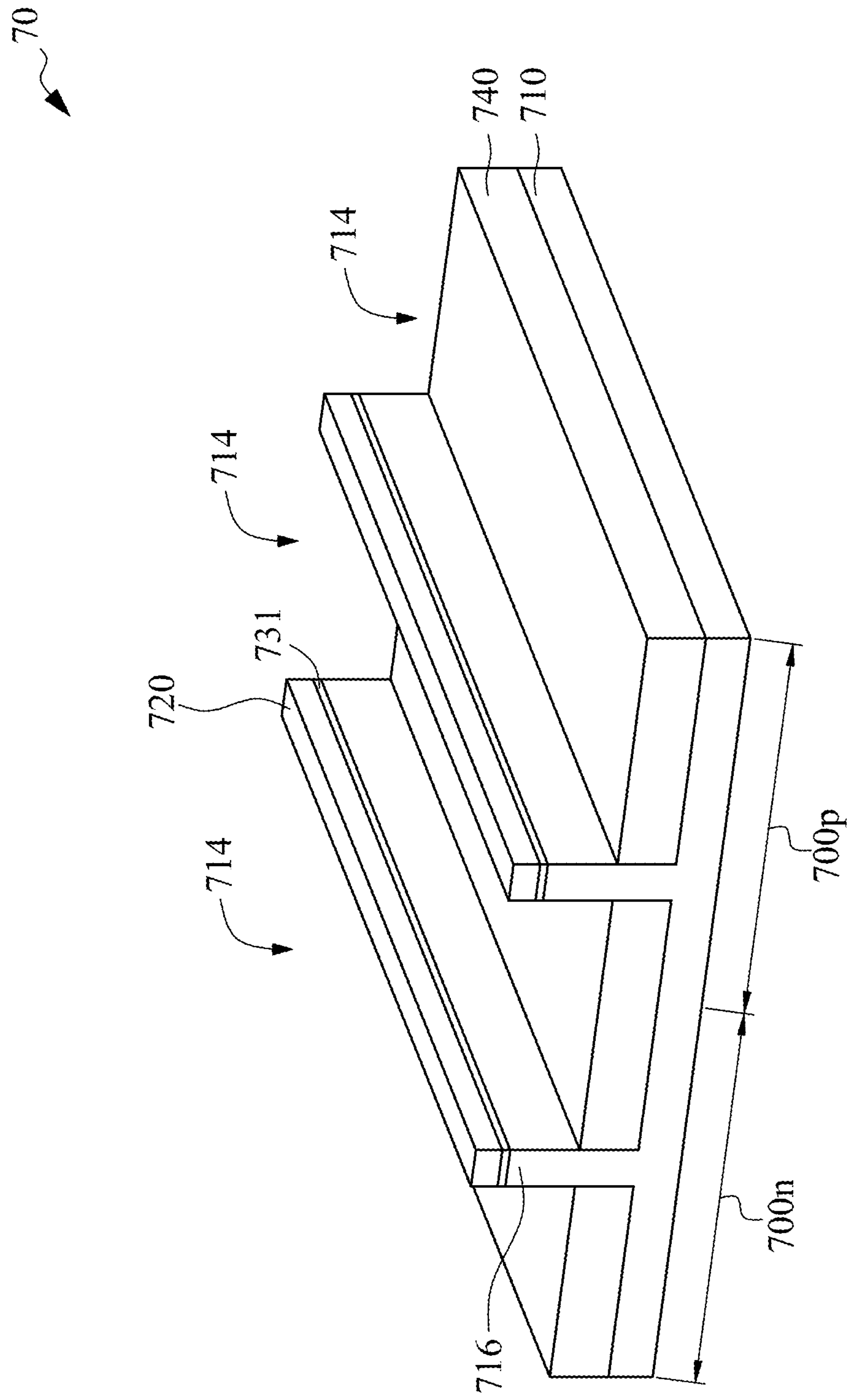

The substrate 710 and the mask layer 720 include different compositions, and hence have high deposition selectivity therebetween. Reference is made to FIG. 18C. Shallow trench isolation (STI) regions 740 are formed in the trenches 714 using an area-selective atomic layer deposition (AS-ALD) without overfilling the trenches 714 followed by a CMP process and a dry etch process, and hence a manufacturing cost is reduced. In other words, no additional CMP and etching processes are required to form the STI regions 740. The substrate 710 and the STI regions 740 have bonds therebetween with a bonding energy greater than bonds between the STI regions 740 and the mask layer 720. The surface of substrate 710 exposed by the trenches 714 can be referred to as a growth area (GA), while the surface of the mask layer can be referred to as non-growth area (NGA). The mask layer 720 and the protective layer 731 are then removed such as by a dry etch, a wet etch, or a combination thereof.

Figure 18D:
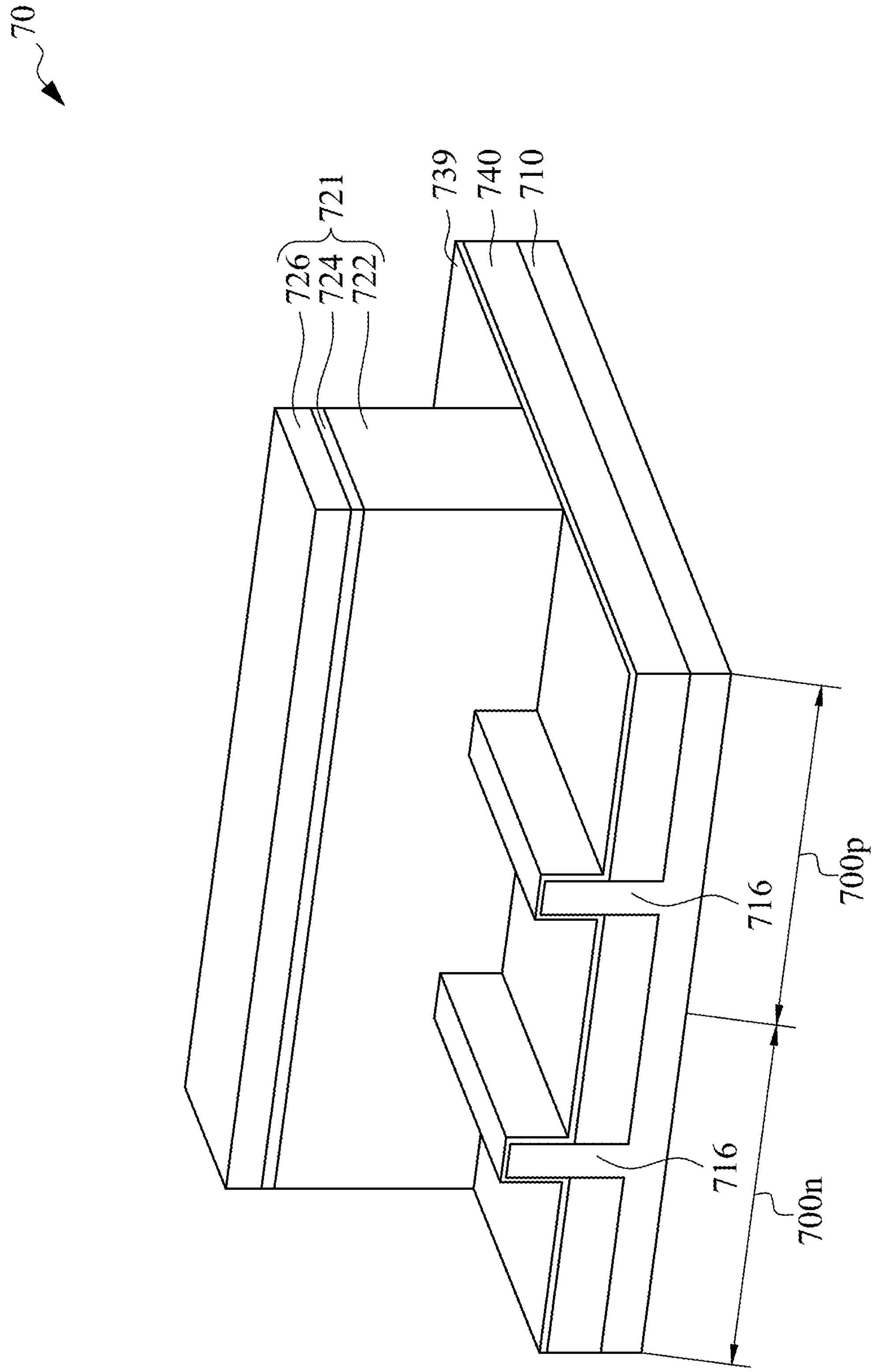

Reference is made to FIG. 18D. Then, a dummy dielectric layer 739 is conformally formed to cover the semiconductor fins 716 and the STI regions 740. In some embodiments, the dummy dielectric layer 739 may include silicon dioxide, silicon nitride, a high-x dielectric material or other suitable material. In various examples, the dummy dielectric layer 739 may be deposited by an ALD process, a CVD process, a subatmospheric CVD (SACVD) process, a flowable CVD process, a PVD process, or other suitable process. By way of example, the dummy dielectric layer 739 may be used to prevent damage to the semiconductor fins 716 by subsequent processing (e.g., subsequent formation of the dummy gate structure).

Subsequently, at least one dummy gate structure 721 is formed over the dummy dielectric layer 739, the semiconductor fins 716, and the STI regions 740. The dummy gate structure 721 includes a dummy gate electrode 722, a pad layer 724 formed over the dummy gate electrode 722, and a hard mask layer 726 formed over the pad layer 724. In some embodiments, a dummy gate layer (not shown) may be formed over the dummy dielectric layer 739, and the pad layer 724 and the hard mask layer 726 are formed over the dummy gate layer. The dummy gate layer is then patterned using the pad layer 724 and the hard mask layer 726 as masks to form the dummy gate electrode 722. As such, the dummy gate electrode 722, the pad layer 724, and the hard mask layer 726 are referred to as the dummy gate structure 721. In some embodiments, the dummy gate electrode 722 may be made of polycrystalline-silicon (poly-Si), poly-crystalline silicon-germanium (poly-SiGe), or other suitable materials. The pad layer 724 may be made of silicon dioxide or other suitable materials, and the hard mask layer 726 may be made of silicon nitride or other suitable materials.

Figure 18E:
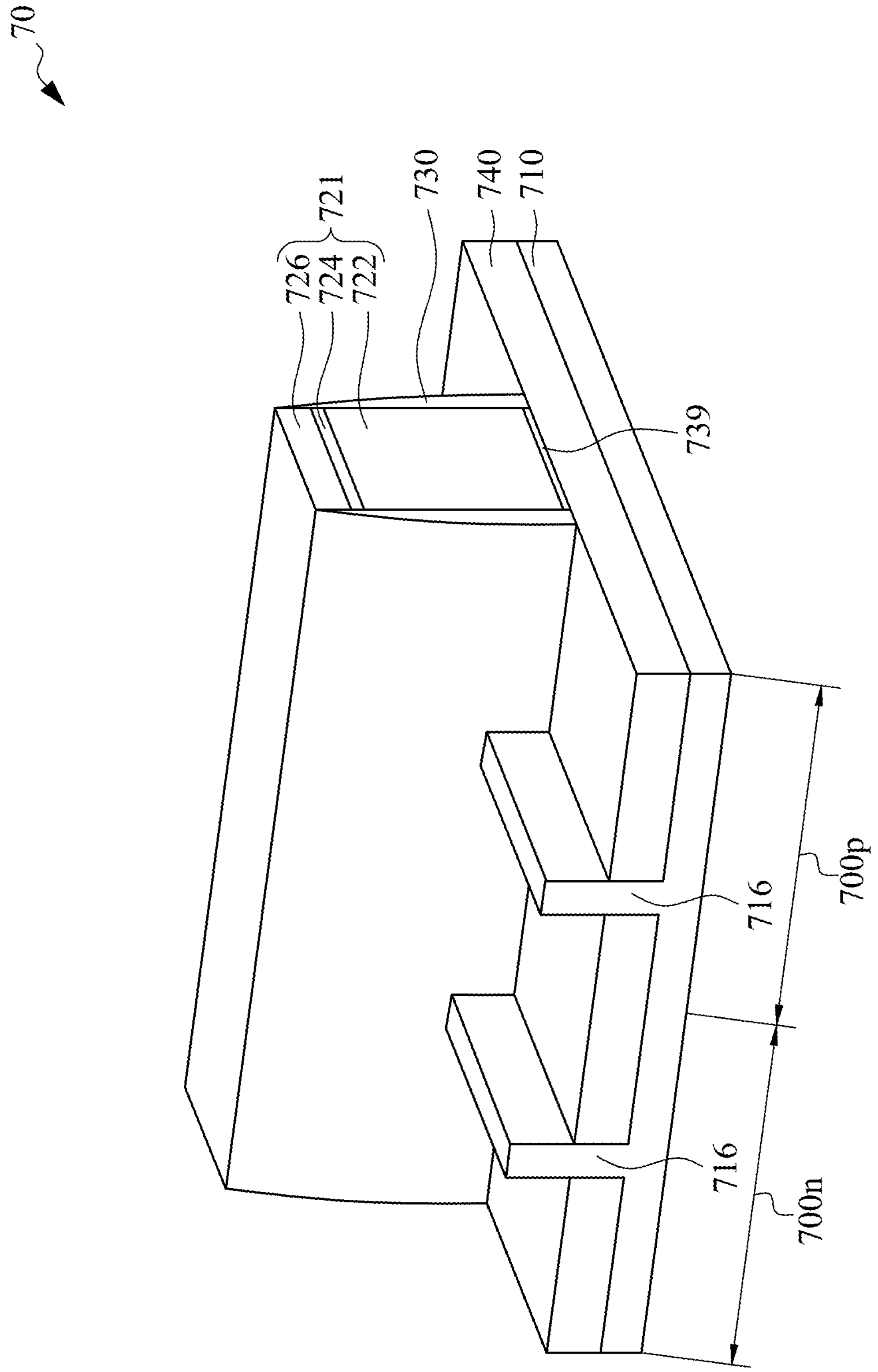

Reference is made to FIG. 18E. Portions of the dummy dielectric layer 739 uncovered by the dummy gate structure 721 are removed to expose the semiconductor fins 716. Spacer structures 730 are then formed at least on opposite sides of the dummy gate structure 721. The spacer structures 730 may include a seal spacer and a main spacer (not shown). The spacer structures 730 include one or more dielectric materials, such as silicon oxide, silicon nitride, silicon oxynitride, SiCN, $SiC_xO_yN_z$, or combinations thereof. The seal spacers are formed on sidewalls of the dummy gate structure 721 and the main spacers are formed on the seal spacers. The spacer structures 730 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 730 may include blanket forming spacer layers and then performing etching operations to remove the horizontal portions of the spacer layers. The remaining vertical portions of the spacer layers form the spacer structures 730.

Figure 18F:
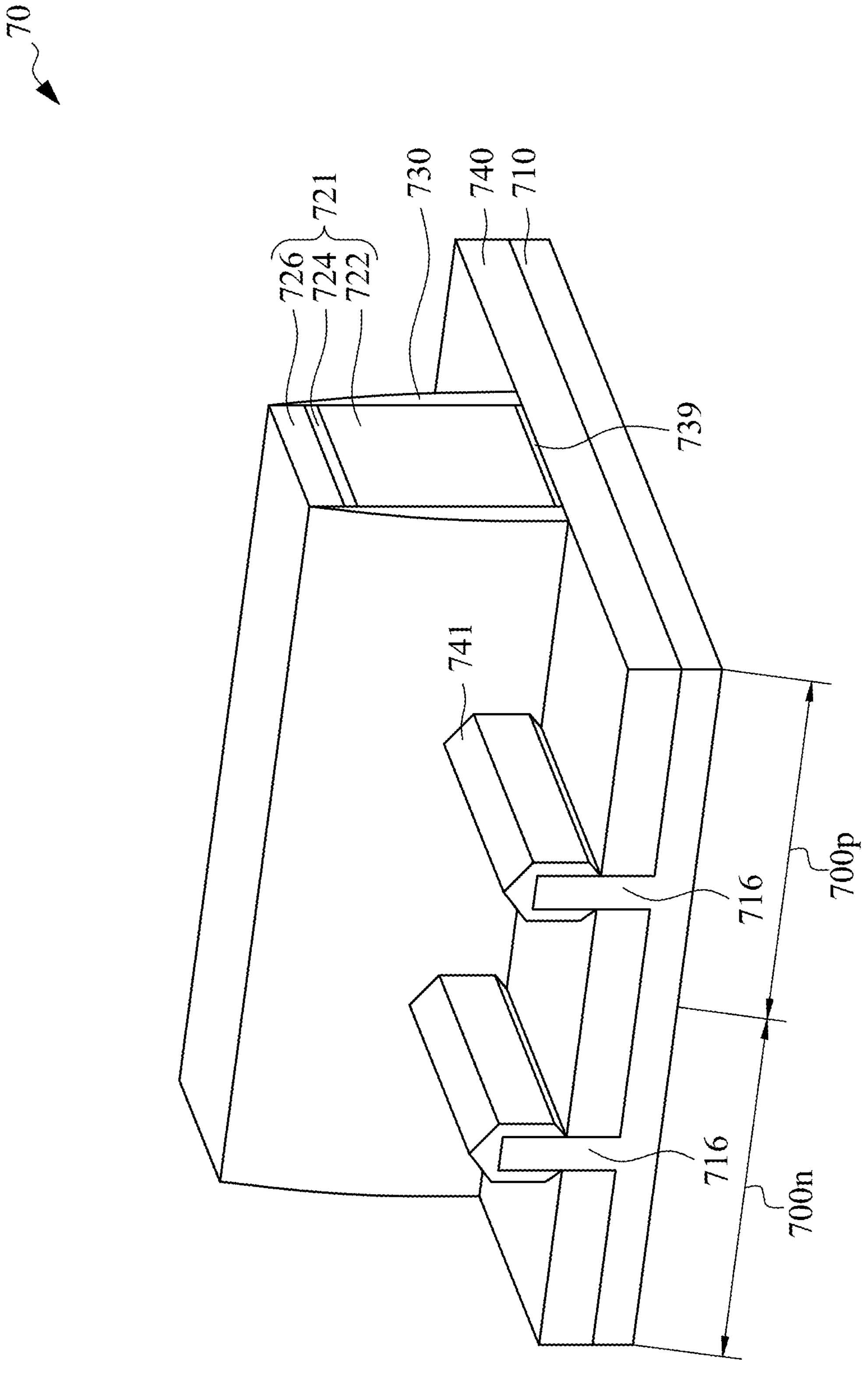

Reference is made to FIG. 18F. Source/drain epitaxial structures 741 are then formed on portions of the semiconductor fins 716 uncovered by the dummy gate structure 721 and the spacer structures 730 by performing, for example, a selectively growing process. The source/drain epitaxy structures 741 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The source/drain epitaxy structures 741 have suitable crystallographic orientations (e.g., a (100), (110), or (111) crystallographic orientation). In some embodiments, the source/drain epitaxy structures 741 include source/drain epitaxial structures. In some embodiments, where an N-type device is desired, the source/drain epitaxy structures 741 may include an epitaxially growing silicon phosphorus (SiP) or silicon carbon (SiC). In some embodiments, where a P-type device is desired, the epitaxial structures 340 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 18G:
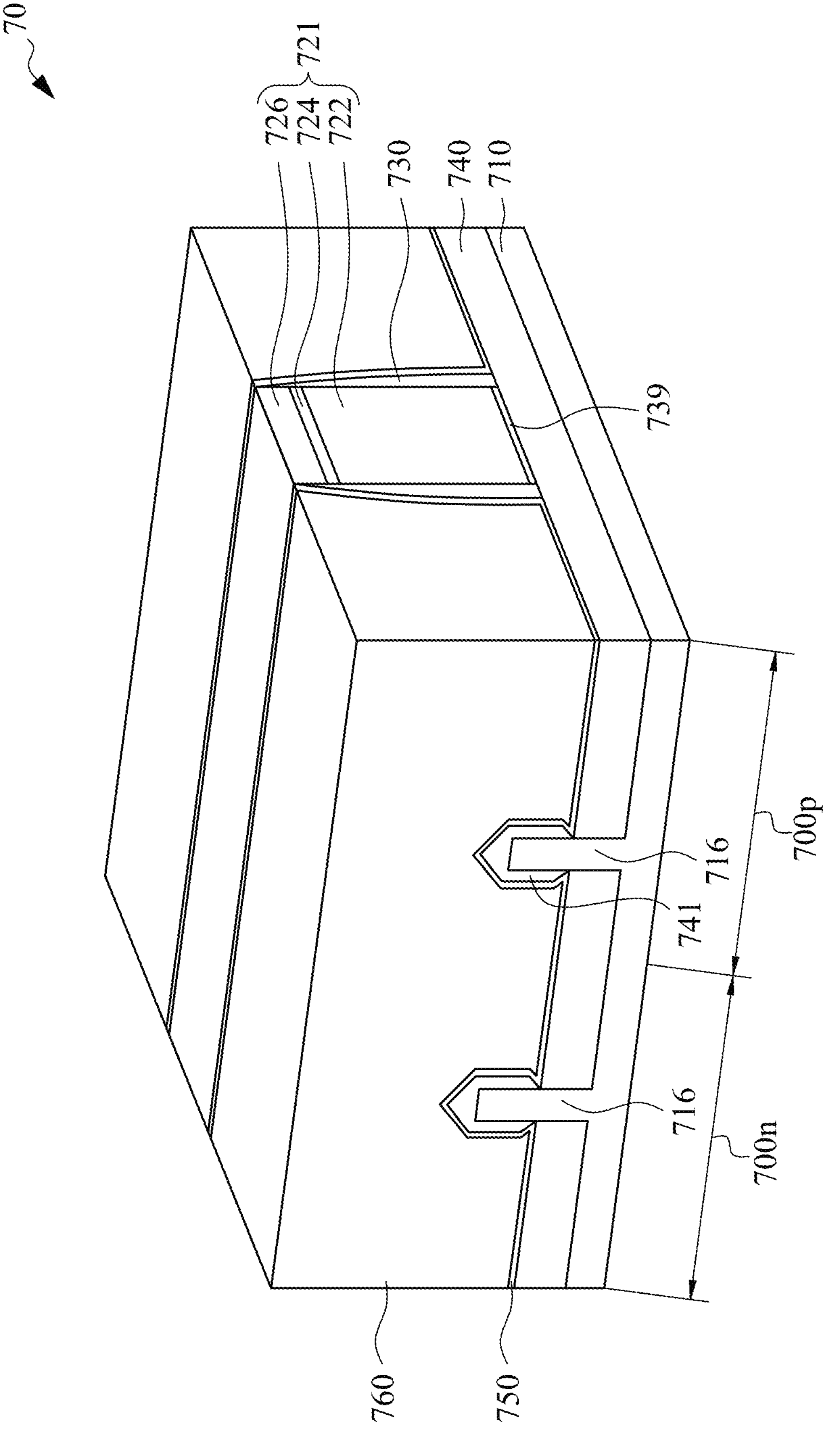

Reference is made to FIG. 18G. A contact etch stop layer (CESL) 750 is conformally formed over the structure of FIG. 18F. In some embodiments, the CESL 750 can be a stressed layer or layers. In some embodiments, the CESL 750 has a tensile stress and is formed of $Si_3N_4$. In some other embodiments, the CESL 750 includes materials such as oxynitride. In yet some other embodiments, the CESL 750 may have a composite structure including a plurality of layers, such as a silicon nitride layer overlying a silicon oxide layer. The CESL 350 can be formed using plasma enhanced CVD (PECVD), however, other suitable methods, such as low pressure CVD (LPCVD), atomic layer deposition (ALD), and the like, can also be used.

An interlayer dielectric (ILD) 760 is then formed on the CESL 750. The ILD 760 may be formed by chemical vapor deposition (CVD), high-density plasma CVD, spin-on, sputtering, or other suitable methods. In some embodiments, the ILD 760 includes silicon oxide. In some other embodiments, the ILD 760 may include silicon oxy-nitride, silicon nitride, or a low-k material. Then, a planarization process, such as a chemical mechanical planarization (CMP) process, is performed to planarize the ILD 760 and the CESL 750 to expose the dummy gate structure 721.

Figure 18H:
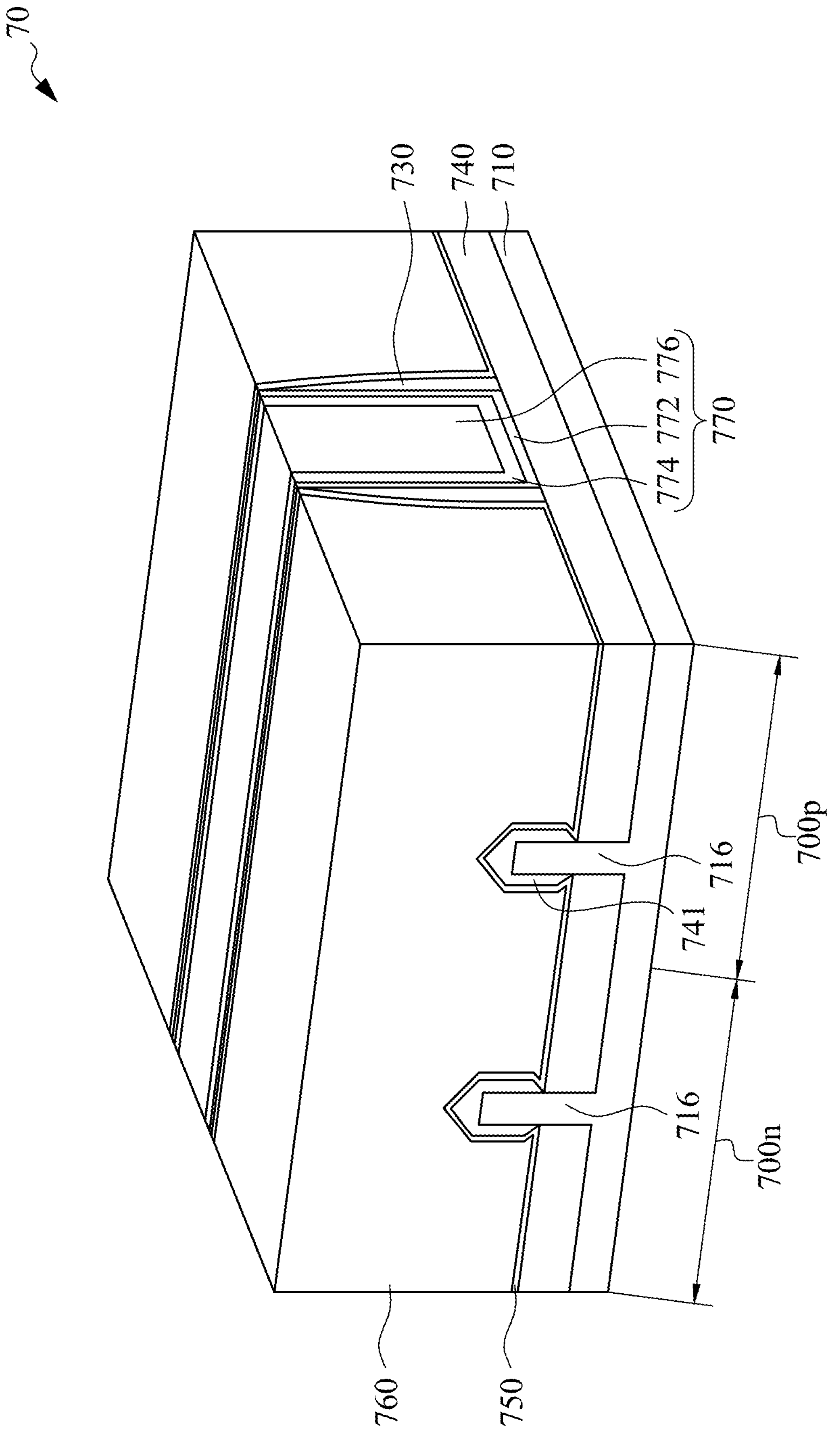

Reference is made to FIG. 18H Next, the dummy dielectric layer 739 and the dummy gate structure 721, which includes the dummy gate electrode 722, the pad layer 724 and the hard mask layer 726, are replaced with a replacement gate stack 770, which include a metal gate electrode 776 and replacement gate dielectrics.

The dummy gate electrode 722, the pad layer 724, the hard mask layer 726 and dummy dielectric layer 739 (FIG. 18G) are first removed in one or a plurality of etching steps, resulting in a trench (opening) to be formed between the spacer structures 730. In the formation of the replacement gate stack 770, a gate dielectric layer (FIG. 18H) is first formed, which extends into the trench left by the removed dummy dielectric layer 739 and the removed dummy gate structure 721, and may have a portion extending over ILD 760. In accordance with some embodiments of the present disclosure, the gate dielectric includes an interfacial layer (IL) 772 as its lower part. The IL 772 may include an oxide layer such as a silicon oxide layer, which is formed through a chemical oxidation process or a deposition process. The gate dielectric may also include a high-k dielectric layer 774 formed over the IL 772. The high-k dielectric layer 774 is formed as a conformal layer, and includes a high-k dielectric material such as hafnium oxide, lanthanum oxide, aluminum oxide, zirconium oxide, or the like. The dielectric constant (k-value) of the high-k dielectric material is higher than 3.9, and may be higher than about 7.0. In accordance with some embodiments of the present disclosure, the high-k dielectric layer 774 in the gate dielectric is formed using ALD or CVD.

The metal gate electrode 776 is formed over the gate dielectric and filling the remaining portion of the trench. The formation of the metal gate electrode 776 may include a plurality of deposition processes to deposit a plurality of conductive layers, and performing a planarization step to remove the excess portions of the conductive layers over the ILD 760. The deposition of the conductive layers may be performed using conformal deposition methods such as ALD or CVD.

Figure 18I:
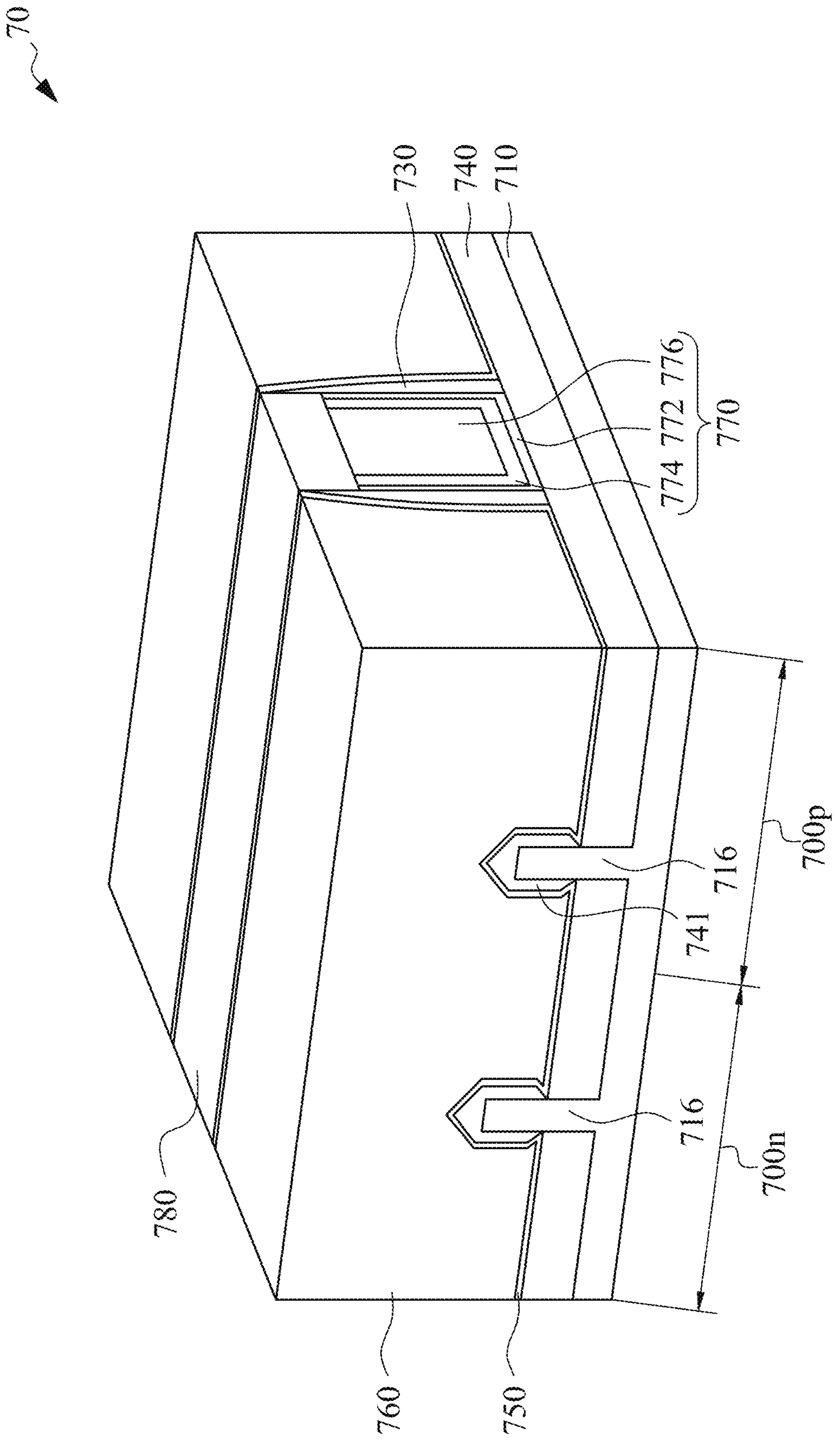

The metal gate electrode 776 may include a diffusion barrier layer and one (or more) work-function layer over the diffusion barrier layer. The diffusion barrier layer may be formed of titanium nitride (TiN), which may (or may not) be doped with silicon to form TiSiN. The work-function layer determines the work function of the gate, and includes at least one layer, or a plurality of layers formed of different materials. The specific material of the work-function layer is selected according to whether the respective FinFET is an n-type FinFET or a p-type FinFET. For example, for the n-type FinFET in the n-type region 700*n*, the work-function layer may include a TaN layer and a titanium aluminum (TiAl) layer over the TaN layer. For the p-type FinFET in the p-type region 700*p*, the work-function layer may include a TaN layer, a TiN layer over the TaN layer, and a TiAl layer over the TiN layer. After the deposition of the work-function layer(s), another barrier layer, which may be another TiN layer, is formed. The metal gate electrode 776 may also include a filling metal, which may be formed of tungsten or cobalt, for example. After the formation of the replacement gate stack 770, the replacement gate stack 770 is etched back, and dielectric hard mask 780 is formed over the etched-back replacement gate stack 770. The resulting structure is shown in FIG. 18I.

Figure 18J:
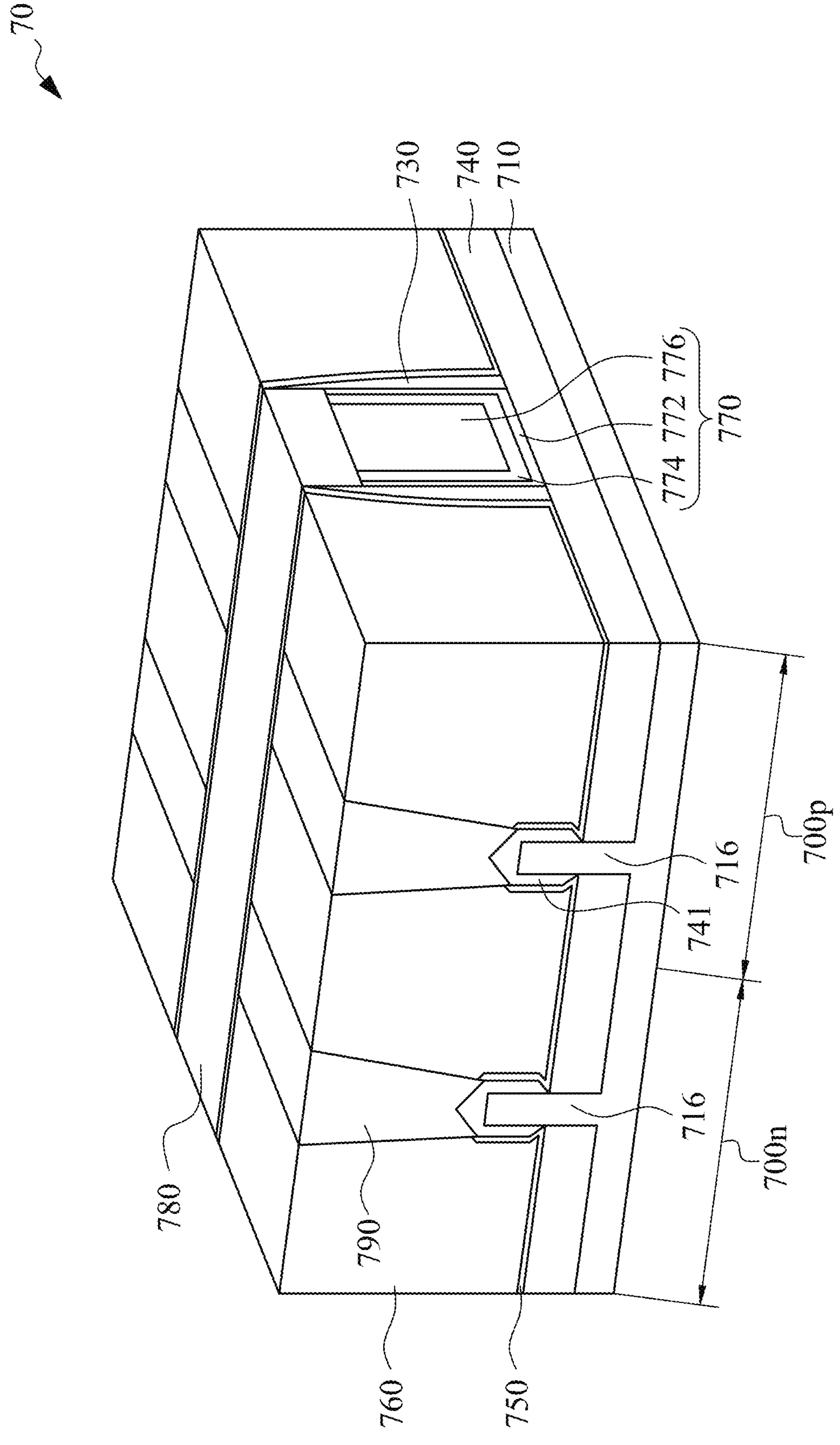

Reference is made to FIG. 18J. A plurality of source/drain contacts 790 are formed over the source/drain epitaxial structures 741. For example, a plurality of the source/drain openings are formed through the ILD 760 and the CESL 750 to expose the source/drain epitaxy structures 741, and conductive materials are filled in the openings and over the source/drain epitaxy structures 741. The excess portions of the conductive materials are removed to form the source/drain contacts 790. The source/drain contacts 790 may be made of tungsten, aluminum, copper, or other suitable materials.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that by using a plasma removal procedure with a controlled plasma energy, a self-aligned growth on the first region is achieved. Another advantage is that no additional lithography and etching processes are required, and hence a manufacturing cost is reduced. Yet another advantage is that the selectivity of the nucleation of the as-deposited film can be promoted by the AS-ALD without forming an inhibitor on the second region.

In some embodiments, a method of forming a semiconductor device includes pulsing a first precursor over a substrate such that the first precursor comprises a first plurality of precursor molecules adsorbing on a first region of the substrate and a second plurality of precursor molecules adsorbing on a second region of the substrate, performing a first purge after pulsing the first precursor, after performing the first purge, performing a plasma removal procedure to the substrate to remove the first plurality of precursor molecules from the first region of the substrate, while leaving the second plurality of precursor molecules on the second region of the substrate, pulsing a second precursor to react with the second plurality of precursor molecules to form a monolayer of a film, and performing a second purge after pulsing the second precursor. In some embodiments, performing the plasma removal procedure includes applying a bias to the substrate. In some embodiments, pulsing the second precursor is performed such that an oxide is formed on the substrate, and the method further includes after performing the second purge, performing a surface recovery step to remove the oxide using a plasma. In some embodiments, performing the surface recovery step further includes applying a bias to the substrate. In some embodiments, the method further includes prior to pulsing the first precursor over the substrate, treating the substrate with a plasma. In some embodiments, treating the substrate with the plasma includes applying a bias to the substrate.

In some embodiments, a method of forming a semiconductor device includes placing a substrate in a chamber, wherein the substrate comprises a first region and a second region having a composition different from a composition of the second region, introducing a first precursor to the chamber, wherein the first precursor comprises a first plurality of precursor molecules binding the first region with first bonds and a second plurality of precursor molecules binding the second region with second bonds, purging the chamber with an inert gas, breaking the second bonds that bind the second plurality of precursor molecules and the second region, while leaving the first bonds that bind the first plurality of precursor molecules and the first region intact, introducing a second precursor to the chamber, and purging the second precursor. In some embodiments, the first bonds have a binding energy different from a binding energy of the second bonds. In some embodiments, the first bonds have a binding energy greater than a binding energy of the second bonds. In some embodiments, breaking the second bonds includes applying a direct current (DC) bias, an alternating current (AC) bias, or a DC/AC superposed bias to the substrate. In some embodiments, breaking the second bonds includes applying a radio frequency (RF) bias to the substrate. In some embodiments, breaking the second bonds includes delivering a treatment gas to a plasma source connected to the chamber, generating a plasma from the treatment gas, and using the plasma to remove the second plurality of precursor molecules binding the second region. In some embodiments, the treatment gas includes He, Ne, Ar, Kr, Xe, Rn, or a combination thereof. In some embodiments, the method further includes prior to introducing the first precursor to the chamber, performing a clean operation to the substrate, wherein the clean operation includes delivering a treatment gas to a plasma source connected to the chamber, generating a plasma from the treatment gas, and using the plasma to clean the substrate.

In some embodiments, a method of forming a semiconductor device includes introducing a metal-containing precursor to a substrate, wherein the substrate comprises a non-metal region and a metal region adjacent to the non-metal region, after introducing the metal-containing precursor, biasing the substrate to remove precursor molecules of the metal-containing precursor from the metal region, and introducing an oxygen-containing precursor to the substrate to form a first material on the non-metal region and a second material on the metal region, wherein the first material is formed by reacting the oxygen-containing precursor with the precursor molecules of the metal-containing precursor on the non-metal region, and the second material is formed by reacting the oxygen-containing precursor with the metal region. In some embodiments, the method further includes during biasing the substrate, introducing argon to the substrate. In some embodiments, the method further includes after introducing the oxygen-containing precursor to the substrate, removing the second material using a plasma. In some embodiments, removing the second material using the plasma includes biasing the substrate during removing the second material. In some embodiments, the first material is aluminum oxide, and the second material is tungsten oxide. In some embodiments, the non-metal region includes silicon oxide, and the metal region includes tungsten.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
- forming a conductive feature over a substrate;
- forming a metal capping layer over the conductive feature;
- forming a dielectric layer over the conductive feature;
- etching the dielectric layer to form a via opening extending through the dielectric layer to expose the metal capping layer; and
- forming a conductive via in the via opening, wherein forming the conductive via in the via opening comprises:
  - pulsing a first precursor over the substrate such that the first precursor comprises a first plurality of precursor molecules adsorbing on the metal capping layer and a second plurality of precursor molecules adsorbing on the dielectric layer;
- performing a first purge after pulsing the first precursor;
- after performing the first purge, performing a plasma removal procedure to the substrate to remove the second plurality of precursor molecules from the dielectric layer, while leaving the first plurality of precursor molecules on the metal capping layer;
- pulsing a second precursor to react with the first plurality of precursor molecules to form a monolayer of a film; and
- performing a second purge after pulsing the second precursor.

2. The method of claim 1, wherein performing the plasma removal procedure comprises:
- applying a bias to the substrate.

3. The method of claim 1, further comprising:
- prior to pulsing the first precursor over the substrate, treating the substrate with a plasma.

4. The method of claim 3, wherein treating the substrate with the plasma comprises:
- applying a bias to the substrate.

5. A method of forming a semiconductor device, comprising:
- forming a conductive feature over a substrate;
- forming a metal capping layer over the conductive feature;
- forming a dielectric layer over the conductive feature;
- etching the dielectric layer to form a via opening extending through the dielectric layer to expose the metal capping layer; and
- forming a conductive via in the via opening, wherein forming the conductive via in the via opening comprises:
- placing the substrate in a chamber;
- introducing a first precursor to the chamber, wherein the first precursor comprises a first plurality of precursor molecules binding the metal capping layer with first bonds and a second plurality of precursor molecules binding the dielectric layer with second bonds;
- purging the chamber with an inert gas;
- breaking the second bonds that bind the second plurality of precursor molecules and the dielectric layer, while leaving the first bonds that bind the first plurality of precursor molecules and the metal capping layer intact;
- introducing a second precursor to the chamber; and
- purging the second precursor.

6. The method of claim 5, wherein the first bonds have a binding energy different from a binding energy of the second bonds.

7. The method of claim 5, wherein the first bonds have a binding energy greater than a binding energy of the second bonds.

8. The method of claim 5, wherein breaking the second bonds comprises:
- applying a direct current (DC) bias, an alternating current (AC) bias, or a DC/AC superposed bias to the substrate.

9. The method of claim 5, wherein breaking the second bonds comprises:
- applying a radio frequency (RF) bias to the substrate.

10. The method of claim 5, wherein breaking the second bonds comprises:
- delivering a treatment gas to a plasma source connected to the chamber;
- generating a plasma from the treatment gas; and
- using the plasma to remove the second plurality of precursor molecules binding the dielectric layer.

11. The method of claim 10, wherein the treatment gas comprises He, Ne, Ar, Kr, Xe, Rn, or a combination thereof.

12. The method of claim 5, further comprising:
- prior to introducing the first precursor to the chamber, performing a clean operation to the substrate, wherein the clean operation comprises:
  - delivering a treatment gas to a plasma source connected to the chamber;
  - generating a plasma from the treatment gas; and
  - using the plasma to clean the substrate.

13. A method of forming a semiconductor device, comprising:
- forming a conductive feature over a substrate;
- forming a metal capping layer over the conductive feature, wherein the metal capping layer comprises Co, Cu, W, Al, Mn, Ru or a combination thereof;
- forming a dielectric layer over the conductive feature;

etching the dielectric layer to form a via opening extending through the dielectric layer to expose the metal capping layer; and forming a conductive via in the via opening, wherein forming the conductive via in the via opening comprises:

placing the substrate in a chamber;

introducing a first precursor to the chamber, wherein the first precursor comprises a first plurality of precursor molecules binding the metal capping layer with first bonds and a second plurality of precursor molecules binding the dielectric layer with second bonds;

purging the chamber with an inert gas;

breaking the second bonds that bind the second plurality of precursor molecules and the dielectric layer, while leaving the first bonds that bind the first plurality of precursor molecules and the metal capping layer intact;

introducing a second precursor to the chamber; and purging the second precursor.

14. The method of claim 13, wherein the first bonds have a binding energy different from a binding energy of the second bonds.

15. The method of claim 13, wherein the first bonds have a binding energy greater than a binding energy of the second bonds.

16. The method of claim 13, wherein breaking the second bonds comprises:

applying a direct current (DC) bias, an alternating current (AC) bias, or a DC/AC superposed bias to the substrate.

17. The method of claim 13, wherein breaking the second bonds comprises:

applying a direct current (DC) bias to the substrate.

18. The method of claim 13, wherein breaking the second bonds comprises:

applying an alternating current (AC) bias to the substrate.

19. The method of claim 13, wherein breaking the second bonds comprises:

applying a DC/AC superposed bias to the substrate.

20. The method of claim 13, wherein breaking the second bonds comprises:

applying a radio frequency (RF) bias to the substrate.

* * * * *